United States Patent
Bae et al.

(10) Patent No.: US 12,364,075 B2
(45) Date of Patent: Jul. 15, 2025

(54) DISPLAY DEVICE INCLUDING REFLECTIVE ELECTRODE ON BANK PATTERN CONFIGURED TO IMPROVE LUMINOUS EFFICIENCY, AND METHOD OF MANUFACTURING THE SAME

(71) Applicant: Samsung Display Co., LTD., Yongin-si (KR)

(72) Inventors: Sung Geun Bae, Yongin-si (KR); Jang Soon Park, Yongin-si (KR); Jeong Hyun Lee, Yongin-si (KR); Hyun Wook Lee, Yongin-si (KR); Da Sol Jeong, Yongin-si (KR); Won Hyeong Heo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 665 days.

(21) Appl. No.: 17/695,665

(22) Filed: Mar. 15, 2022

(65) Prior Publication Data

US 2022/0367768 A1 Nov. 17, 2022

(30) Foreign Application Priority Data

May 13, 2021 (KR) .......................... 10-2021-0062120

(51) Int. Cl.
*H10H 20/856* (2025.01)
*H01L 23/00* (2006.01)
(Continued)

(52) U.S. Cl.
CPC ........... *H10H 20/856* (2025.01); *H01L 24/82* (2013.01); *H01L 25/167* (2013.01);
(Continued)

(58) Field of Classification Search
CPC .... H10H 20/856; H10H 20/857; H10H 29/37; H10H 29/49; H10H 29/857;
(Continued)

(56) References Cited

U.S. PATENT DOCUMENTS 10,943,947 B2   3/2021   Im et al.
11,824,138 B2   11/2023  Beak et al.
(Continued)

FOREIGN PATENT DOCUMENTS

KR   10-2019-0121894 A   10/2019
KR   10-2020-0006209 A   1/2020
(Continued)

*Primary Examiner* — Matthew E. Gordon
(74) *Attorney, Agent, or Firm* — Womble Bond Dickinson (US) LLP

(57) ABSTRACT

According to some embodiments of the present disclosure, a display device includes a substrate, a first electrode and a second electrode on the substrate, and spaced apart from each other, a light emitting element between the first electrode and the second electrode, a first bank pattern and a second bank pattern protruding in a display direction of the display device, a first contact electrode and a second contact electrode electrically connecting the light emitting element to the first electrode and the second electrode, respectively, the first contact electrode including a first contact light-transmitting layer, and a first reflective electrode including a first reflective layer, and a first light-transmitting layer including a same material as the first contact light-transmitting layer, at least a portion of the first reflective electrode being on the first bank pattern.

10 Claims, 21 Drawing Sheets

(51) Int. Cl.
  *H01L 25/16*   (2023.01)
  *H10D 86/40*   (2025.01)
  *H10D 86/60*   (2025.01)
  *H10H 20/01*   (2025.01)

(52) U.S. Cl.
  CPC ........... *H10D 86/441* (2025.01); *H10D 86/60* (2025.01); *H01L 24/24* (2013.01); *H01L 2224/24011* (2013.01); *H01L 2224/24051* (2013.01); *H01L 2224/24105* (2013.01); *H01L 2224/24147* (2013.01); *H01L 2224/82106* (2013.01); *H01L 2224/82986* (2013.01); *H10H 20/0363* (2025.01)

(58) Field of Classification Search
  CPC ...... H10D 86/441; H10D 86/60; H01L 24/24; H01L 24/82; H01L 25/167
  USPC .......................................................... 257/91
  See application file for complete search history.

(56) References Cited

U.S. PATENT DOCUMENTS

| 12,166,017 B2 | 12/2024 | Lim et al. | |
| 2019/0326348 A1* | 10/2019 | Im | G09G 3/32 |
| 2020/0176656 A1* | 6/2020 | Bae | H10H 20/01 |
| 2021/0091050 A1* | 3/2021 | Heo | H10D 86/60 |

FOREIGN PATENT DOCUMENTS

| KR | 10-2020-0006651 A | 1/2020 |
| KR | 10-2020-0049394 A | 5/2020 |
| KR | 10-2020-0115868 A | 10/2020 |

\* cited by examiner

DISPLAY DEVICE INCLUDING REFLECTIVE ELECTRODE ON BANK PATTERN CONFIGURED TO IMPROVE LUMINOUS EFFICIENCY, AND METHOD OF MANUFACTURING THE SAME

CROSS-REFERENCE TO RELATED APPLICATION

The application claims priority to, and the benefit of, Korean Patent Application No. 10-2021-0062120, filed May 13, 2021, which is hereby incorporated by reference for all purposes as if fully set forth herein.

BACKGROUND

1. Field

The present disclosure relates to a display device, and a method of manufacturing the same.

2. Discussion

In recent years, as interest in information displays is increasing, research and development on display devices are continuously conducted.

SUMMARY

An aspect of the present disclosure provides a display device in which reliability of an electrical signal in a display device can be improved, and in which luminous efficiency can be improved.

The present disclosure are not limited to the above-described aspect, and other aspects not mentioned will be clearly understood by those skilled in the art from the following description and the accompanying drawings.

According to some embodiments of the present disclosure, a display device includes a substrate, a first electrode and a second electrode on the substrate, and spaced apart from each other, a light emitting element between the first electrode and the second electrode, a first bank pattern and a second bank pattern protruding in a display direction of the display device, a first contact electrode and a second contact electrode electrically connecting the light emitting element to the first electrode and the second electrode, respectively, the first contact electrode including a first contact light-transmitting layer, and a first reflective electrode including a first reflective layer, and a first light-transmitting layer including a same material as the first contact light-transmitting layer, at least a portion of the first reflective electrode being on the first bank pattern.

The first reflective electrode may be spaced apart from the first contact electrode.

The display device may further include a second reflective electrode, at least a portion of which being on the second bank pattern, and including a second light-transmitting layer and a second reflective layer.

The first light-transmitting layer may include a same material as the second light-transmitting layer, wherein the first reflective layer includes a same material as the second reflective layer.

The first light-transmitting layer may include any one of indium tin oxide (ITO), indium zinc oxide (IZO), zinc oxide (ZnO), or indium tin zinc oxide (ITZO).

The first reflective layer may include any one of Ag, Mg, Al, Pt, Pd, Au, Ni, Nd, Ir, Cr, Li, Ca, LiF/Ca, LiF/Al, Mo, Ti or Cu.

The first light-transmitting layer may be between the first reflective layer and the first bank pattern.

A thickness of the first contact light-transmitting layer may be less than or equal to a thickness of the first light-transmitting layer.

The display device may further include a first insulating layer on the first electrode and the second electrode, and a second insulating layer, at least a portion of which being on the light emitting element, and including an inorganic material.

The display device may further include a first insulating layer on the first electrode and the second electrode, and a second insulating layer, at least a portion of which being on the light emitting element, and including an organic material, wherein the second contact electrode includes a second contact light-transmitting layer, and wherein the first contact light-transmitting layer and the second contact light-transmitting layer include a same material.

According to other embodiments of the present disclosure, a display device includes a substrate, a first electrode and a second electrode on the substrate, and spaced apart from each other, a light emitting element between the first electrode and the second electrode, a first bank pattern and a second bank pattern protruding in a display direction of the display device, and a first contact electrode and a second contact electrode electrically connecting the light emitting element to the first electrode and the second electrode, respectively, the first contact electrode including a (1-1)th area, a (2-1)th area, a first contact light-transmitting layer in the (1-1)th area, a first light-transmitting layer including a same material as the first contact light-transmitting layer in the (2-1)th area, and a first reflective layer positioned on the first light-transmitting layer in the (2-1)th area.

The first contact electrode may be electrically connected to the first electrode in the (1-1)th area, and is on the first bank pattern in the (2-1)th area.

The second contact electrode may include a (1-2)th area, a (2-2)th area, a second contact light-transmitting layer in the (1-2)th area, and electrically connected to the second electrode in the (1-2)th area, a second light-transmitting layer including a same material as the second contact light-transmitting layer in the (2-2)th area, and a second reflective layer positioned on the second light-transmitting layer in the (2-2)th area, wherein the first contact light-transmitting layer is electrically connected to the first electrode in the (1-1)th area.

According to other embodiments of the present disclosure, a method of manufacturing a display device configured to emit light in a display direction, may include locating a first electrode and a second electrode spaced apart from each other on a substrate, locating a light emitting element on the substrate, locating a first bank pattern and a second bank pattern protruding in a display direction of the display device, forming a base electrode to cover at least a portion of each of the first bank pattern and the second bank pattern, the base electrode including a base light-transmitting layer, and a base reflective layer on the base light-transmitting layer, removing at least a portion of the base reflective layer, and providing a first contact electrode including a contact light-transmitting layer including a same material as the base light-transmitting layer, and electrically connecting the light emitting element and the first electrode.

The method may further include forming a base photo-resist layer on the base electrode, and performing a photoresist process on the base photoresist layer using a mask, which includes a full-tone area and a half-tone area, by providing a first reflective electrode on the first bank pattern, providing a second reflective electrode on the second bank pattern, providing an unetched contact electrode electrically connected to the light emitting element, forming a first photoresist layer on the first reflective electrode and the second reflective electrode, and forming a second photoresist layer on the unetched contact electrode.

Positions of the first reflective electrode and the second reflective electrode may correspond to positions of the full-tone area, wherein a position of the unetched contact electrode corresponds to a position of the half-tone area.

The method may further include removing the second photoresist layer by exposing at least a portion of the unetched contact electrode.

The providing the first reflective electrode may include providing a first light-transmitting layer and a first reflective layer positioned on the first light-transmitting layer, wherein the providing the unetched contact electrode includes providing the contact light-transmitting layer, and a contact reflective layer on the contact light-transmitting layer, and wherein the providing the first contact electrode includes exposing at least a portion of the contact light-transmitting layer by removing the contact reflective layer after the providing the unetched contact electrode.

The locating the first bank pattern and the second bank pattern may be performed after the locating the first electrode and the second electrode.

The first electrode and the first reflective electrode may be spaced apart from each other, wherein the contact light-transmitting layer of the first contact electrode electrically connects the first electrode and the light emitting element.

BRIEF DESCRIPTION OF THE DRAWINGS

The accompanying drawings, which are included to provide a further understanding of the present disclosure, and are incorporated in and constitute a part of this specification, illustrate embodiments of the present disclosure, and, together with the description, serve to explain principles of the present disclosure.

DETAILED DESCRIPTION

Figure 1:
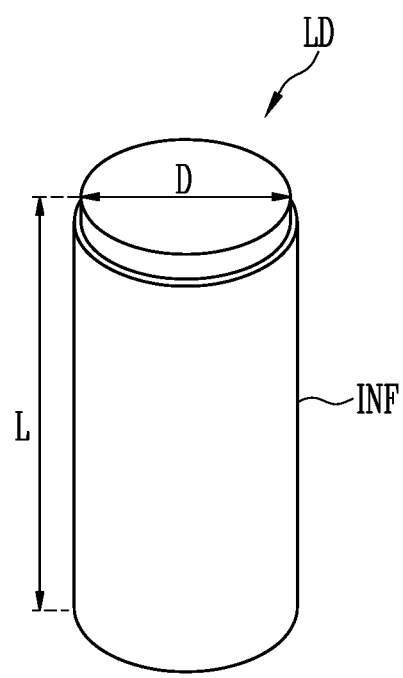
FIG. 1 is a perspective view illustrating a light emitting element according to some embodiments.

The embodiments described in the present specification are intended to clearly explain the spirit of the present disclosure to those skilled in the art to which the present disclosure pertains. Therefore, the present disclosure is not limited by the embodiments described herein. The scope of the present disclosure should be construed as including modifications or variations that do not depart from the spirit of the present disclosure.

Terms used in the present specification have been selected from general terms that are currently widely used in consideration of functions of the present disclosure. However, this may vary according to the intention or custom of a person skilled in the art to which the present disclosure pertains, or the emergence of new technologies. However, unlike this, when a specific term is defined and used in an arbitrary meaning, the meaning of the term will be separately described. Therefore, the terms used in the present specification should be interpreted based on the actual meanings of the terms and contents throughout the present specification, not the names of the terms.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

In the present specification, when it is determined that a detailed description of a well-known configuration or function related to the present disclosure may obscure the subject matter of the present disclosure, a detailed description thereof will be omitted as necessary.

The present disclosure relates to a display device and a method of manufacturing the same. Hereinafter, a display device and a method of manufacturing the same according to embodiments will be described with reference to FIGS. 1 to 21.

Figure 2:
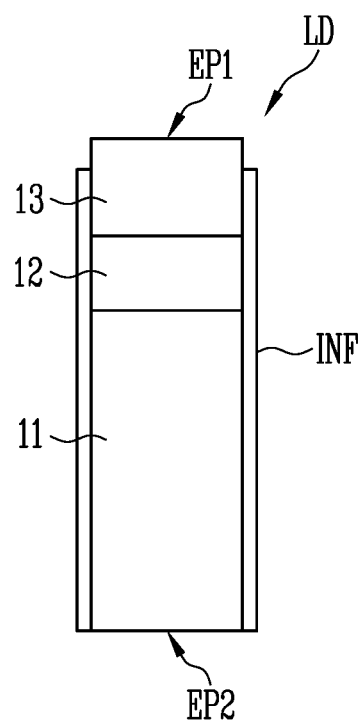
FIG. 2 is a cross-sectional view illustrating the light emitting element according to some embodiments.

FIGS. 1 and 2 show a light emitting element LD included in a display device according to some embodiments. FIG. 1 is a perspective view illustrating a light emitting element according to some embodiments. FIG. 2 is a cross-sectional view illustrating the light emitting element according to some embodiments. FIGS. 1 and 2 show the light emitting element LD having a columnar shape, but the type and/or shape of the light emitting element LD is not limited thereto. Hereinafter, for convenience of description, the present disclosure will be described based on some embodiments in which the light emitting element LD has the columnar shape.

Referring to FIGS. 1 and 2, the light emitting element LD may include a first semiconductor layer 11, a second semiconductor layer 13, and an active layer 12 interposed between the first semiconductor layer 11 and the second semiconductor layer 13. For example, when the direction in which the light emitting element LD is extended is referred to as a length L direction, the light emitting element LD may include the first semiconductor layer 11, the active layer 12, and the second semiconductor layer 13 sequentially stacked along the length L direction.

According to some embodiments, the light emitting element LD may have the column shape. The column shape may include a rod-like shape or a bar-like shape that is long in the length L direction (e.g., that has an aspect ratio that is greater than 1), such as a circular column or a polygonal column, and the shape of the cross section is not particularly limited.

According to some embodiments, the light emitting element LD may include a first end EP1 and a second end EP2. For example, one of the first and second semiconductor layers 11 and 13 may be adjacent to the first end EP1 of the light emitting element LD. The other one of the first and second semiconductor layers 11 and 13 may be adjacent to the second end EP2 of the light emitting element LD.

According to some embodiments, the light emitting element LD may have a size of nanometer scale to micrometer scale. For example, the light emitting element LD may have the diameter D (or width) and/or length L ranging from nanometer scale to micrometer scale. However, the size of the light emitting element LD is not limited thereto.

The first semiconductor layer 11 may be a first conductivity type semiconductor layer. For example, the first semiconductor layer 11 may include an N-type semiconductor layer. As an example, the first semiconductor layer 11 may include the N-type semiconductor layer including any one semiconductor material of InAlGaN, GaN, AlGaN, InGaN, AlN, and InN, and doped with a first conductivity type dopant such as Si, Ge, Sn, and the like.

The active layer 12 may be located on the first semiconductor layer 11, and may be formed in a single-quantum well or multi-quantum well structure. The position of the active layer 12 may be variously changed according to the type of the light emitting element LD.

In some embodiments, a cladding layer doped with a conductive dopant may be formed on and/or under the active layer AL. For example, the cladding layer may be formed of an AlGaN layer or an InAlGaN layer. According to some embodiments, materials such as AlGaN and InAlGaN may be used to form the active layer AL.

The second semiconductor layer 13 may be located on the active layer AL, and may include a semiconductor layer of a different type from the first semiconductor layer 11. For example, the second semiconductor layer 13 may include a P-type semiconductor layer. For example, the second semiconductor layer 13 may include the P-type semiconductor layer including at least one semiconductor material of InAlGaN, GaN, AlGaN, InGaN, AlN, and InN, and may be doped with a second conductivity type dopant such as Mg and the like.

When a voltage that is higher than a threshold voltage is applied to both ends of the light emitting element LD, light may be emitted from the light emitting element LD while electron-hole pairs are coupled in the active layer 12. By controlling the emission of the light emitting element LD using this principle, the light emitting element LD may be used as a light source of various light emitting devices including pixels of a display device.

According to some embodiments, the light emitting element LD may further include an insulating film INF provided on a surface of the light emitting element LD. The insulating film INF may be formed of a single film or a double film, but the present disclosure is not limited thereto, and the insulating film INF may be formed of a plurality of films.

According to some embodiments, the insulating film INF may expose both ends of the light emitting element LD having different respective polarities. For example, the insulating film INF may expose one end of each of the first and second semiconductor layers 11 and 13 positioned at the first and second ends EP1 and EP2 of the light emitting element LD.

According to some embodiments, the insulating film INF may include at least one insulating material of silicon oxide (SiOx), silicon nitride (SiNx), silicon oxynitride (SiOxNy), aluminum oxide (AlOx), and titanium oxide (TiOx), but the present disclosure is not limited thereto.

According to some embodiments, the insulating film INF may secure electrical stability of the light emitting element LD. In addition, even when a plurality of light emitting elements LD are located adjacent to each other, the likelihood of an unwanted short circuit that may occur between the light emitting elements LD can be reduced or prevented.

According to some embodiments, the light emitting element LD may further include an additional component in addition to the first semiconductor layer 11, the active layer 12, the second semiconductor layer 13, and/or the insulating film INF surrounding them. For example, the light emitting element LD may further include one or more phosphor layer, active layer, semiconductor layer, and/or electrode layer located on one end side of the first semiconductor layer 11, the active layer 12 and/or the second semiconductor layer 13. For example, contact electrode layers may be further located at the first and second ends EP1 and EP2 of the light emitting element LD, respectively.

Figure 3:
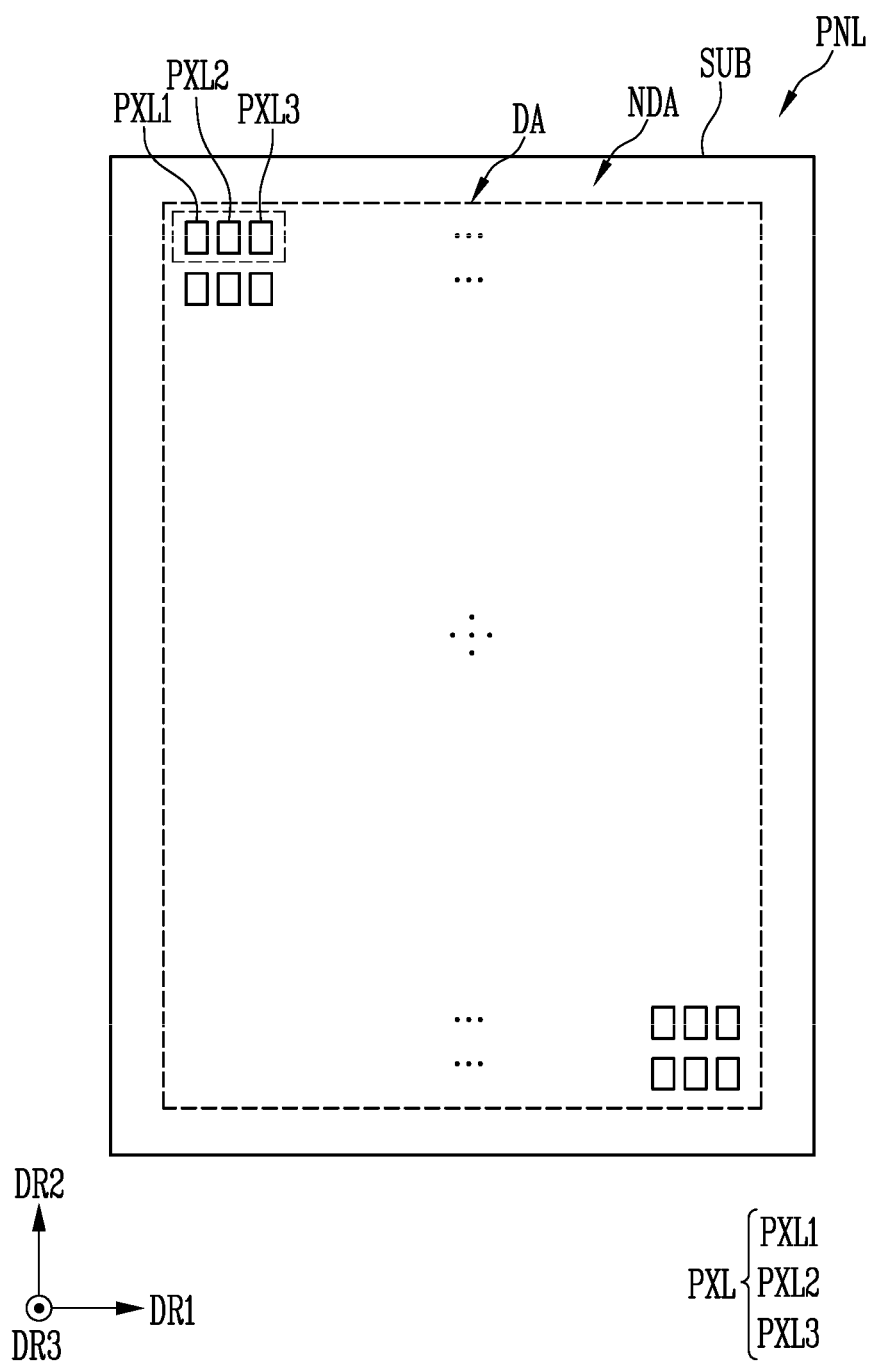
FIG. 3 is a plan view illustrating a display device according to some embodiments.

FIG. 3 is a plan view illustrating a display device according to some embodiments.

In FIG. 3, a display device using the light emitting element LD described with reference to FIGS. 1 and 2 as a light source will be described.

The display device according to some embodiments may be configured to emit light. According to an example, the display device according to some embodiments may emit (or provide) light in a display direction (for example, in a third direction DR3).

Hereinafter, for convenience of description, a display panel PNL included in the display device according to some embodiments will be mainly described.

The display panel PNL may include a pixel PXL including the light emitting element LD. For convenience, in FIG. 3, a structure of the display panel PNL is briefly shown by focusing on a display area DA. In some embodiments, a driving circuit unit (for example, a scan driver and a data driver), wires, and/or pads may be further located on the display panel PNL.

Referring to FIG. 3, the display panel PNL may include a substrate SUB, and the pixel PXL located on the substrate SUB. According to an example, the pixel PXL may include a first pixel PXL1, a second pixel PXL2, and a third pixel PXL3.

The substrate SUB may constitute a base member of the display panel PNL, and may be a rigid or flexible substrate or film. According to some embodiments, the substrate SUB may be a rigid substrate made of glass or tempered glass, a flexible substrate (or a thin film) made of plastic or metal, or at least one insulating layer. However, the material and/or physical properties of the substrate SUB are not particularly limited.

The display panel PNL may include the display area DA and a non-display area NDA. The non-display area NDA may mean an area other than the display area DA.

The display area DA may mean an area in which the pixel PXL is located. The non-display area NDA may mean an area in which the pixel PXL is not located. Various wires, pads, and/or a built-in circuit unit connected to the pixel PXL of the display area NDA may be located in the non-display area NDA. The pixel PXL may be arranged according to a stripe or PENTILE™ arrangement structure (e.g., a PENTILE™ matrix structure, a PENTILE™ structure, or an RGBG structure), but the present disclosure is not limited thereto (PENTILE™ is a registered trademark of Samsung Display Co., Ltd., Republic of Korea).

According to some embodiments, two or more types of pixels PXL emitting light of different colors may be located in the display area DA. For example, the first pixel PXL1 for emitting light of a first color, the second pixel PXL2 for emitting light of a second color, and the third pixel PXL3 for emitting light of a third color may be arranged in the display area DA.

According to some embodiments, at least one of the first to third pixels PXL1, PXL2, and PXL3 located adjacent to each other may constitute one pixel unit capable of emitting light of various colors. For example, each of the first to third pixels PXL1, PXL2, and PXL3 may be a sub-pixel for emitting light of a corresponding color (e.g., a predetermined color). For example, the first pixel PXL1 may be a red pixel for emitting red light, the second pixel PXL2 may be a green pixel for emitting green light, and the third pixel PXL3 may a blue pixel for emitting blue light. However, the color, type, and/or number of pixels PXL constituting each pixel unit is not limited to a specific example.

The pixel PXL may include at least one light source. The light source may be driven by a control signal (for example, a scan signal and a data signal) and a power source. According to some embodiments, the light source may be the light emitting element LD described above with reference to FIGS. 1 and 2.

According to some embodiments, the pixel PXL may be configured as an active pixel. However, the type, structure, and/or driving method of the pixels PXL applicable to the display device is not particularly limited. For example, each pixel PXL may be composed of a pixel of a passive or active type light emitting display device having various structures and/or driving methods.

Hereinafter, the pixel PXL included in the display device according to some embodiments will be described with reference to FIGS. 4 to 10.

Figure 4:
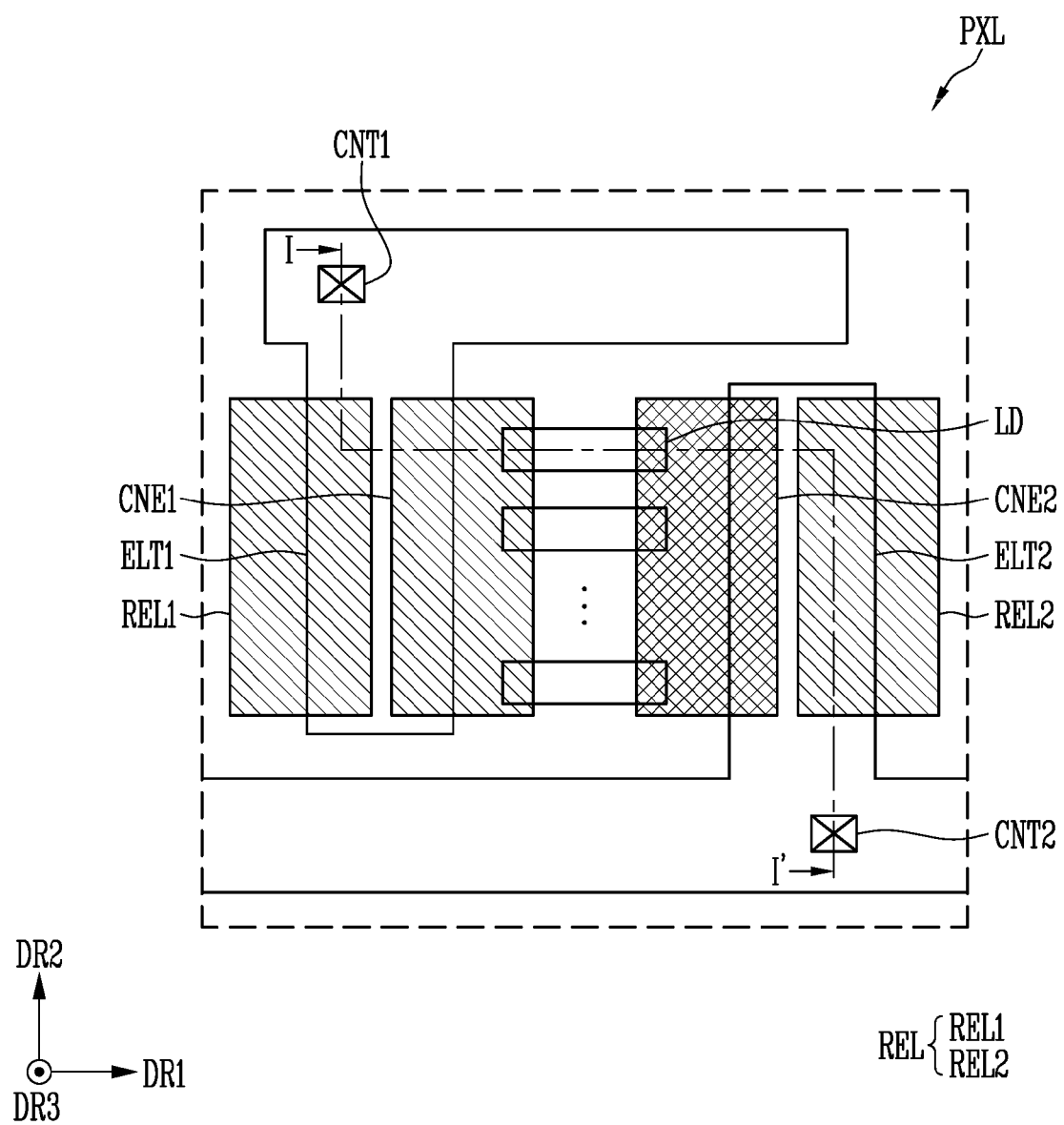
FIG. 4 is a plan view illustrating a pixel according to first embodiments.
Figure 5:
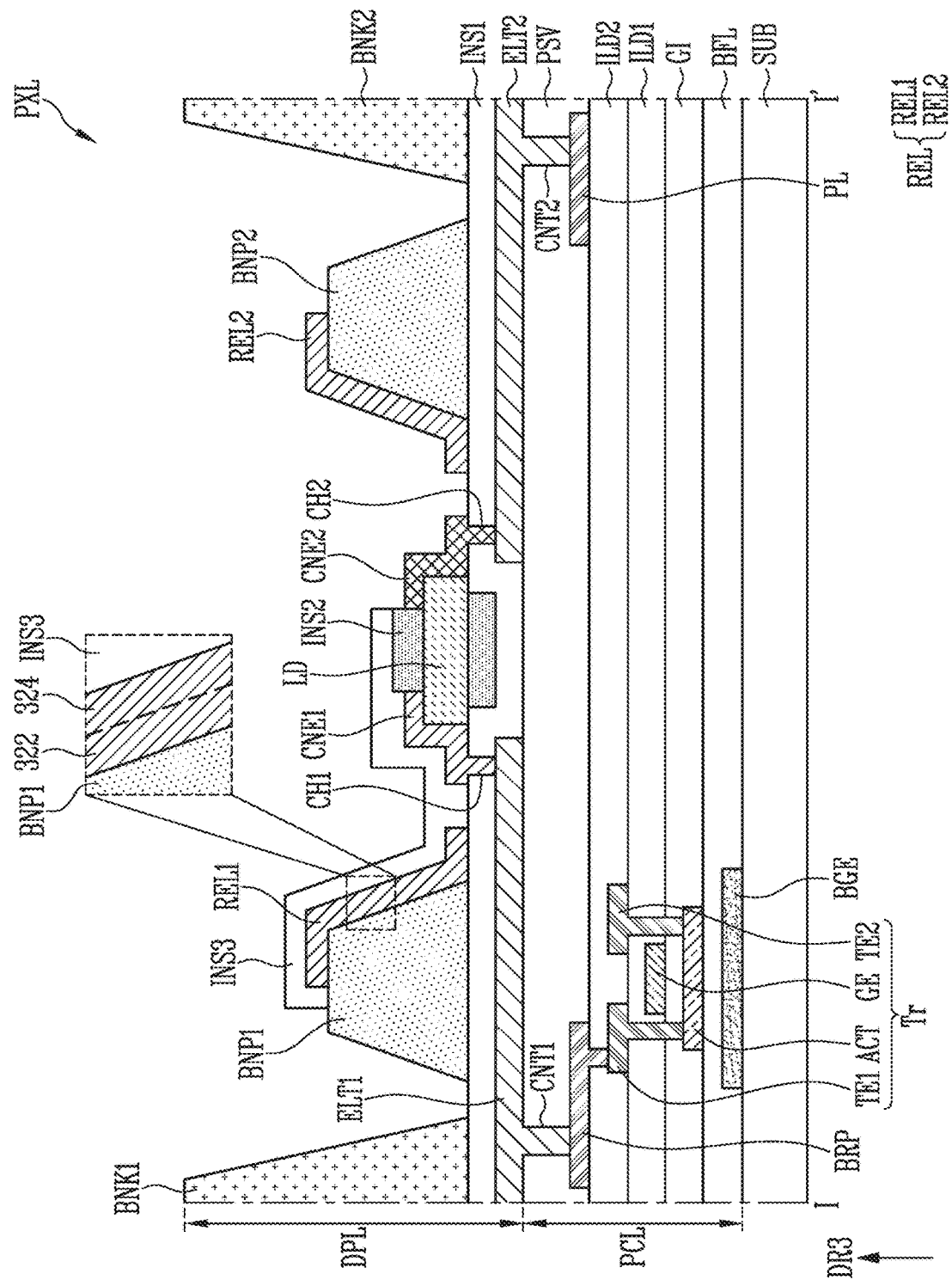
FIG. 5 is a cross-sectional view taken along the line I-I' of FIG. 4.
Figure 6:
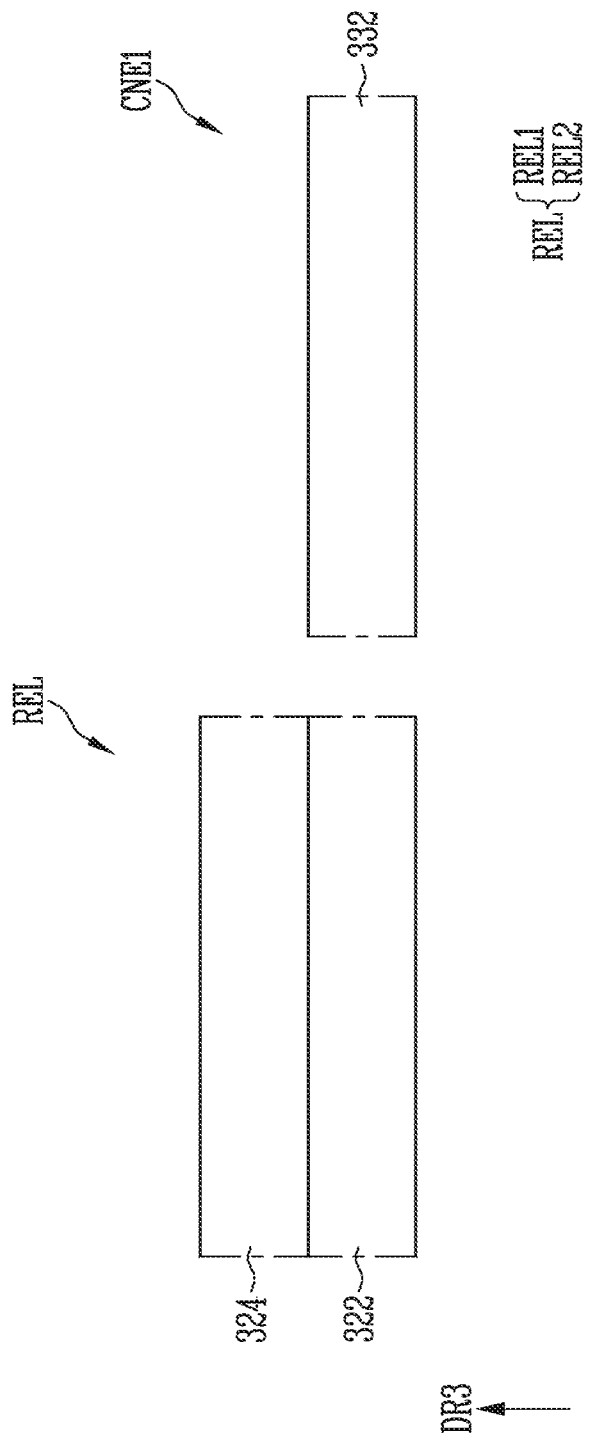
FIG. 6 is a cross-sectional view illustrating a stacked structure of a reflective electrode and a first contact electrode.
Figure 7:
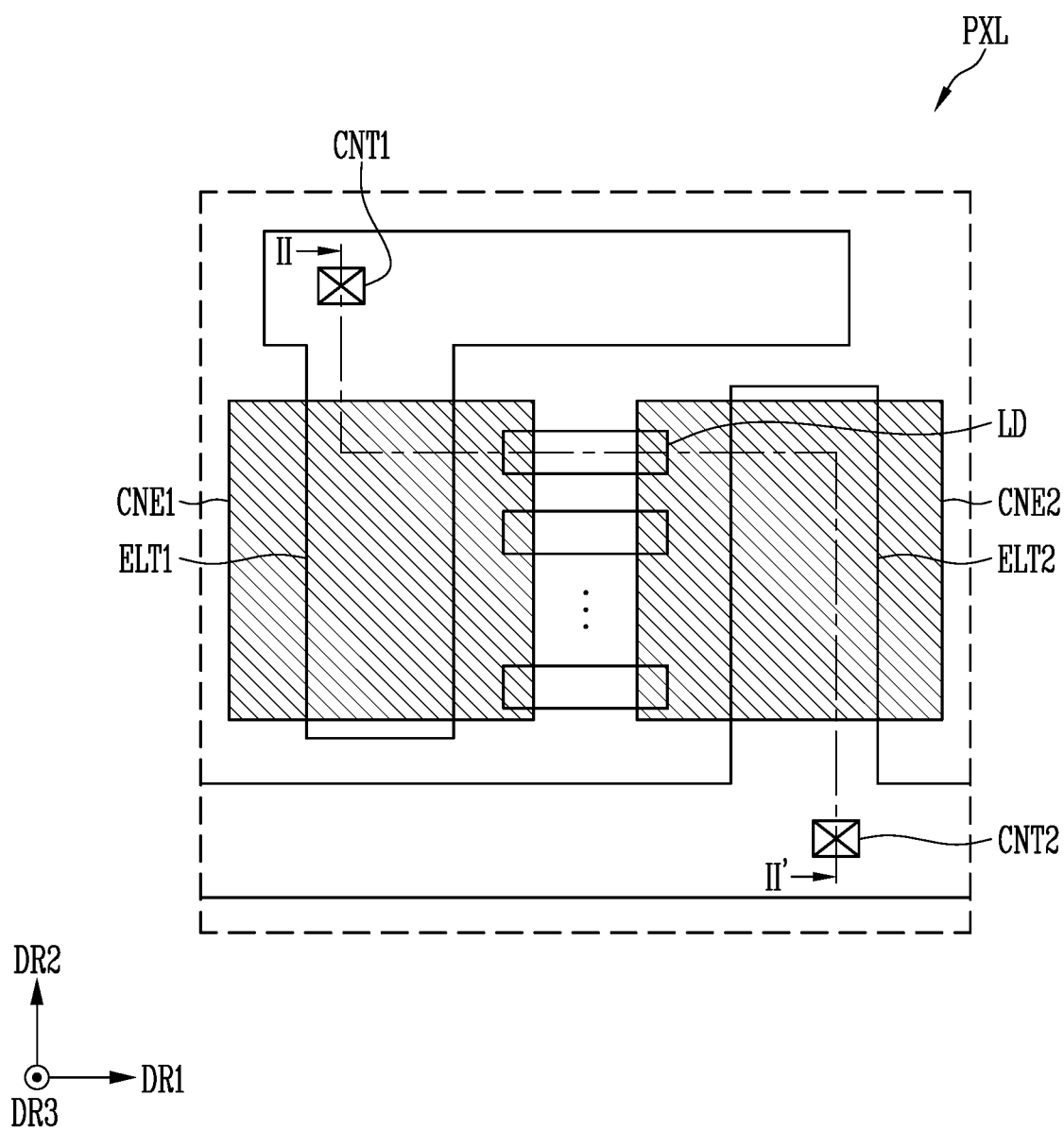
FIG. 7 is a plan view illustrating a pixel according to second embodiments.
Figure 8:
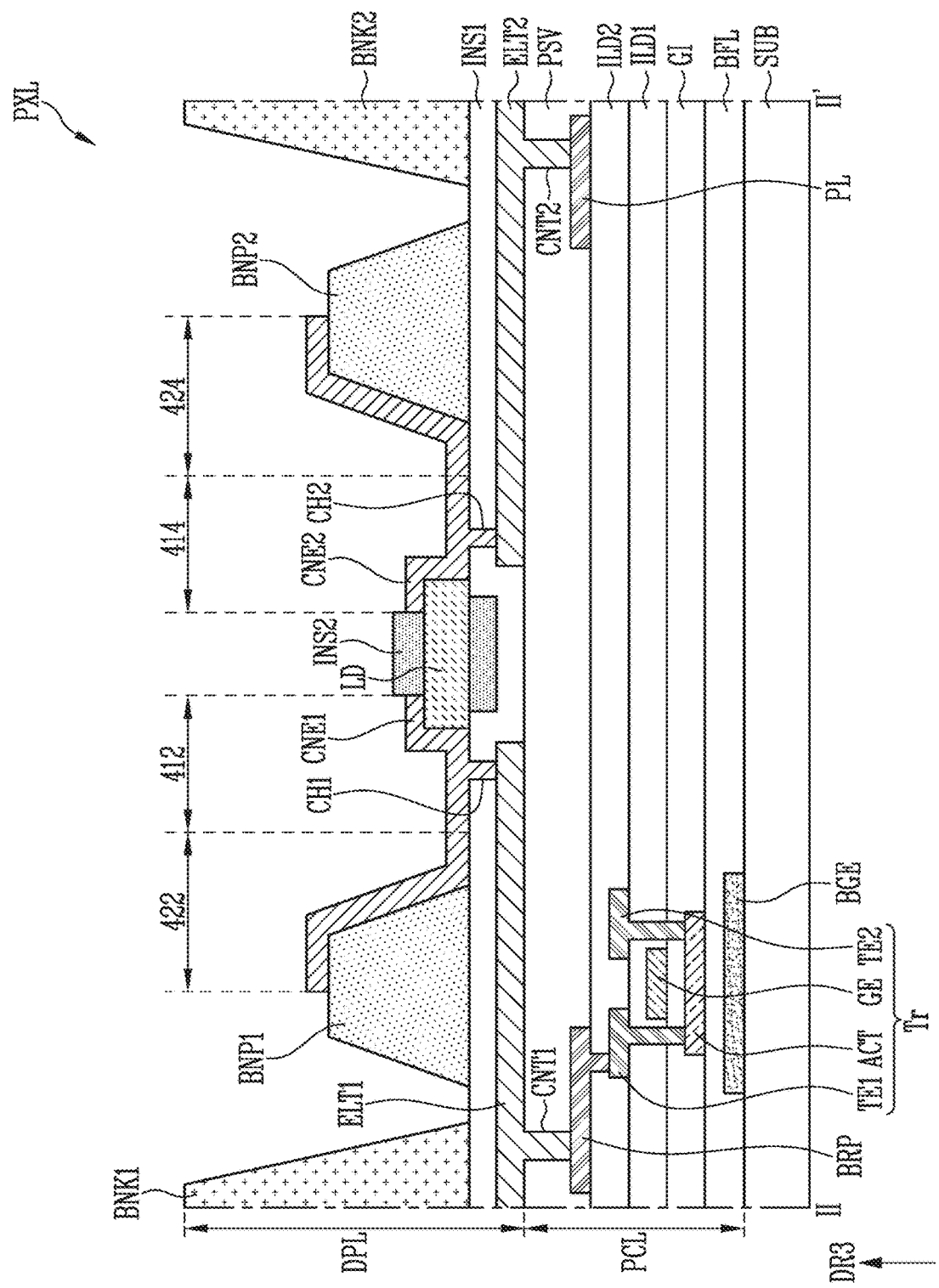
FIG. 8 is a cross-sectional view taken along the line II-II' of FIG. 7.
Figure 9:
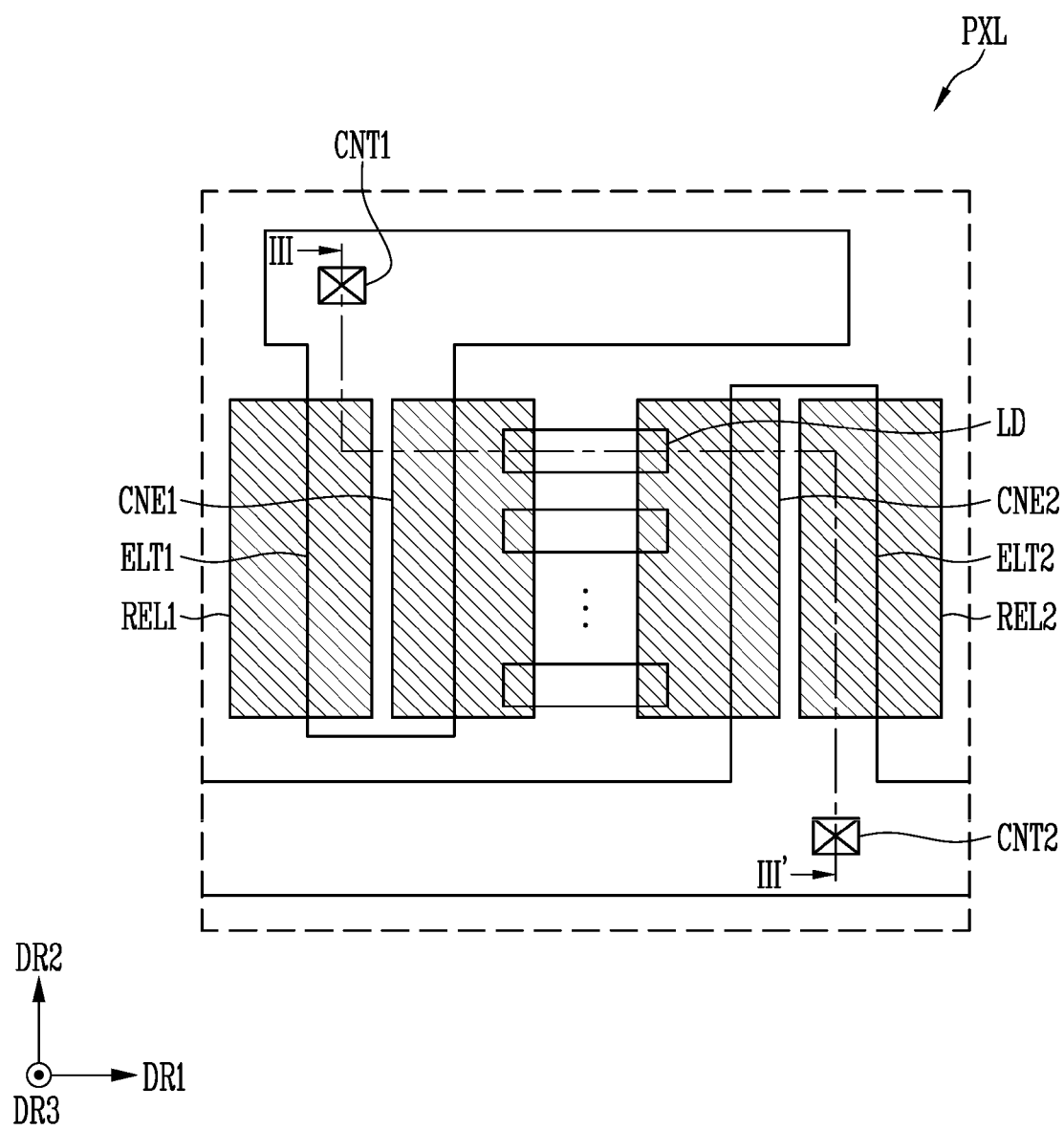
FIG. 9 is a plan view illustrating a pixel according to third embodiments.
Figure 10:
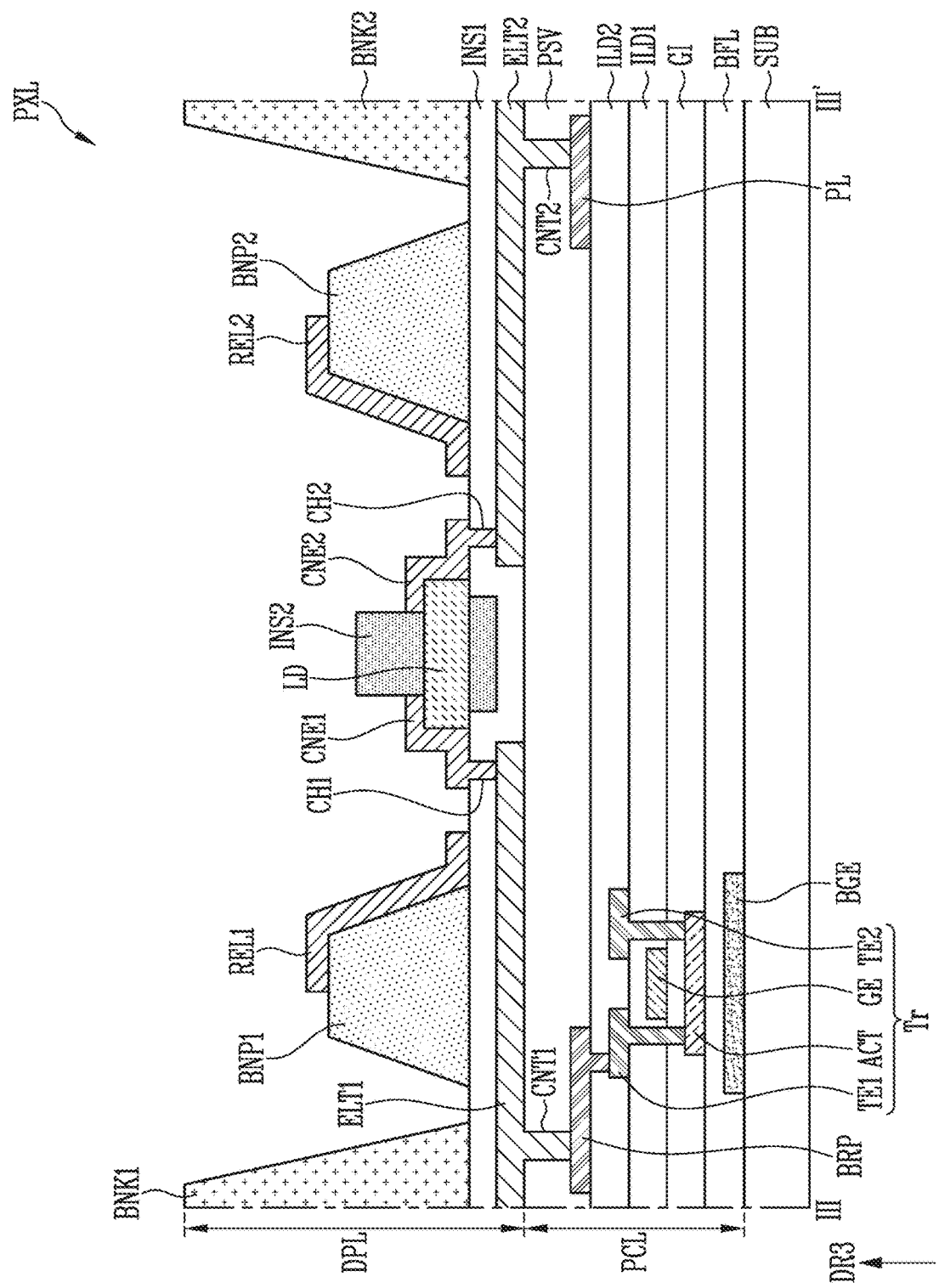
FIG. 10 is a cross-sectional view taken along the line III-III' of FIG. 9.

FIGS. 4 to 6 are diagrams illustrating a pixel PXL according to first embodiments. FIGS. 7 and 8 are diagrams illustrating a pixel PXL according to second embodiments. FIGS. 9 and 10 are diagrams illustrating a pixel PXL according to third embodiments.

First, the pixel PXL according to the first embodiments will be described with reference to FIGS. 4 to 6.

FIG. 4 is a plan view illustrating a pixel according to first embodiments. The pixel PXL shown in FIG. 4 may be any one of the first pixel PXL1, the second pixel PXL2, and the third pixel PXL3 described above with reference to FIG. 3. FIG. 5 is a cross-sectional view taken along the line I-I' of FIG. 4.

Referring to FIG. 4, the pixel PXL may include a first electrode ELT1, a second electrode ELT2, the light emitting element LD, a first contact electrode CNE1, a second contact electrode CNE2, and a reflective electrode REL. According to an example, the reflective electrode REL may include a first reflective electrode REL1 and a second reflective electrode REL2.

According to some embodiments, the first electrode ELT1 and the second electrode ELT2 may be spaced apart from each other to define a trench area in which the light emitting element LD can be located. For example, at least a portion of the first electrode ELT1 may extend in a second direction DR2, and may be spaced apart from the second electrode ELT2 in a first direction DR1. At least a portion of the second electrode ELT2 may extend in the second direction DR2, and may be spaced apart from the first electrode ELT1 in the first direction DR1. In this case, the first direction DR1 and the second direction DR2 may be non-parallel (or may be substantially perpendicular) to each other.

According to some embodiments, the first electrode ELT1 and the second electrode ELT2 may function as alignment electrodes for the light emitting element LD. For example, an electric field may be formed between the first electrode ELT1 and the second electrode ELT2, and the light emitting elements LD may be arranged between the first electrode ELT1 and the second electrode ELT2 based on the electric field. According to some embodiments, the first electrode ELT1 and the second electrode ELT2 might not overlap the light emitting element LD when viewed on a plane.

According to some embodiments, the first electrode ELT1 may be electrically connected to another wiring (for example, a bridge pattern BRP, as shown in FIG. 5) through a first contact portion CNT1. The second electrode ELT2 may be electrically connected to another wire (for example, a power line PL, as shown in FIG. 5) through a second contact portion CNT2.

According to some embodiments, the first electrode ELT1 may not be located on a first bank pattern BNP1, and/or the second electrode ELT2 may not be located on a second bank pattern BNP2. For example, the first electrode ELT1 and the second electrode ELT2 may be flatly arranged on a passivation layer PSV, as shown in FIG. 5.

According to some embodiments, the light emitting elements LD may be arranged in a substantially parallel structure. However, the arrangement structure of the light emitting elements LD is not limited thereto.

According to some embodiments, at least a portion of the light emitting element LD may be located between the first electrode ELT1 and the second electrode ELT2. The light emitting element LD may be located in the trench area defined as an area between the first electrode ELT1 and the second electrode ELT2.

According to some embodiments, the light emitting element LD may be electrically connected to the first electrode ELT1 through the first contact electrode CNE1. The light emitting element LD may be electrically connected to the second electrode ELT2 through the second contact electrode CNE2.

According to some embodiments, the light emitting element LD may emit light based on an electrical signal provided through the first contact electrode CNE1 and based on an electrical signal provided through the second contact electrode CNE2.

According to some embodiments, the first reflective electrode REL1 may be located adjacent to the first contact electrode CNE1. The first reflective electrode REL1 may be spaced apart from the first contact electrode CNE1 in the first direction DR1.

According to some embodiments, at least a portion of the first reflective electrode REL1 may be located on the first bank pattern BNP1.

According to some embodiments, at least a portion of the first reflective electrode REL1 may overlap the first electrode ELT1 when viewed on a plane. The first reflective electrode REL1 might not overlap the first contact electrode CNE1 when viewed on a plane.

According to some embodiments, the second reflective electrode REL2 may be located adjacent to the second contact electrode CNE2. The second reflective electrode REL2 may be spaced apart from the second contact electrode CNE2 in the first direction DR1.

According to some embodiments, at least a portion of the second reflective electrode REL2 may be located on the second bank pattern BNP2.

According to some embodiments, at least a portion of the second reflective electrode REL2 may overlap the second electrode ELT2 when viewed on a plane. The second reflective electrode REL2 might not overlap the second contact electrode CNE2 when viewed on a plane.

According to some embodiments, the first reflective electrode REL1, the first contact electrode CNE1, and the second reflective electrode REL2 may be formed in the same process. A detailed description thereof will be described later with reference to FIGS. 11 to 18.

FIG. 5 shows the pixel PXL according to the first embodiments.

Referring to FIG. 5, the pixel PXL may include the substrate SUB, a pixel circuit unit PCL, and a display element unit DPL.

The substrate SUB may constitute a base surface of the pixel PXL. The substrate SUB may be a rigid or flexible substrate. According to an example, the substrate SUB may include a rigid material or a flexible material, but is not limited to a specific example.

The pixel circuit unit PCL may be located on the substrate SUB. According to an example, the pixel circuit unit PCL may include a buffer layer BFL, a back gate electrode BGE, a transistor Tr, a gate insulating layer GI, a first interlayer insulating layer ILD1, a second interlayer insulating layer ILD2, the bridge pattern BRP, the power line PL, the first contact portion CNT1, the second contact portion CNT2, and the passivation layer PSV.

According to some embodiments, the buffer layer BFL may be located on the substrate SUB. The buffer layer BFL may reduce or prevent impurities from diffusing from an outside. The buffer layer BFL may include at least one of silicon nitride (SiNx), silicon oxide (SiOx), silicon oxynitride (SiOxNy), and a metal oxide such as aluminum oxide (AlOx).

According to some embodiments, the back gate electrode BGE may be located on the substrate SUB. The back gate electrode BGE may overlap a gate electrode GE when viewed on a plane.

According to some embodiments, the transistor Tr may be a thin film transistor. According to some embodiments, the transistor Tr may be a driving transistor. The transistor Tr may include an active layer ACT, a first transistor electrode TE1, a second transistor electrode TE2, and the gate electrode GE.

According to some embodiments, the active layer ACT may refer to a semiconductor layer. The active layer ACT may be located on the buffer layer BFL. The active layer ACT may include at least one of polysilicon, amorphous silicon, and an oxide semiconductor.

According to some embodiments, the active layer ACT may include a first contact region in contact with the first transistor electrode TE1, and a second contact region in contact with the second transistor electrode TE2. The first contact region and the second contact region may be semiconductor patterns doped with impurities. An area between the first contact region and the second contact region may be a channel region. The channel region may be an intrinsic semiconductor pattern that is not doped with impurities.

According to some embodiments, the gate electrode GE may be located on the gate insulating layer GI. The position of the gate electrode GE may correspond to the position of the channel region of the active layer ACT. For example, the gate electrode GE may be located on the channel region of the active layer ACT with the gate insulating layer GI interposed therebetween.

According to some embodiments, the gate insulating layer GI may be located on the active layer ACT. The gate insulating layer GI may include an inorganic material. According to an example, the gate insulating layer GI may include at least one of silicon nitride (SiNx), silicon oxide (SiOx), silicon oxynitride (SiOxNy), and/or aluminum oxide (AlOx). According to some embodiments, the gate insulating layer GI may include an organic material.

According to some embodiments, the first interlayer insulating layer ILD1 may be located on the gate electrode GE. Like the gate insulating layer GI, the first interlayer insulating layer ILD1 may include at least one of silicon nitride (SiNx), silicon oxide (SiOx), silicon oxynitride (SiOxNy), and/or aluminum oxide (AlOx).

According to some embodiments, the first transistor electrode TE1 and the second transistor electrode TE2 may be located on the first interlayer insulating layer ILD1. The first transistor electrode TE1 may penetrate the gate insulating layer GI and the first interlayer insulating layer ILD1 to contact the first contact region of the active layer ACT, and the second transistor electrode TE2 may penetrate the gate insulating layer GI and the first interlayer insulating layer ILD1 to contact the second contact region of the active layer ACT. According to an example, the first transistor electrode TE1 may be a source electrode, and the second transistor electrode TE2 may be a drain electrode, but the present disclosure is not limited thereto.

According to some embodiments, the second interlayer insulating layer ILD2 may be located on the first transistor electrode TE1 and the second transistor electrode TE2. Like the first interlayer insulating layer ILD1 and the gate insulating layer GI, the second interlayer insulating layer ILD2 may include an inorganic material. The inorganic material may include materials as materials constituting the first interlayer insulating layer ILD1 and the gate insulating layer GI, for example, at least one of silicon nitride (SiNx), silicon oxide (SiOx), silicon oxynitride (SiOxNy), and/or aluminum oxide (AlOx). According to some embodiments, the second interlayer insulating layer ILD2 may include an organic material.

According to some embodiments, the bridge pattern BRP may be located on the second interlayer insulating layer ILD2. The bridge pattern BRP may be connected to the first transistor electrode TE1 through a contact hole penetrating the second interlayer insulating layer ILD2.

According to some embodiments, the power line PL may be located on the second interlayer insulating layer ILD2. The power line PL may be connected to the second electrode ELT2 through the second contact portion CNT2.

According to some embodiments, the passivation layer PSV may be positioned on the second interlayer insulating layer ILD2. The passivation layer PSV may cover the bridge pattern BRP and the power line PL. The passivation layer PSV may be provided in a form including an organic insulating layer, an inorganic insulating layer, or the organic insulating layer located on the inorganic insulating layer, but is not limited thereto.

According to some embodiments, the first contact portion CNT1 connected to one area of the bridge pattern BRP, and the second contact portion CNT2 connected to one area of the power line PL, may be formed in the passivation layer PSV.

The display element unit DPL may be located on the pixel circuit unit PCL. The display element unit DPL may include the first electrode ELT1, the second electrode ELT2, a first insulating layer INS1, a first bank BNK1, a second bank BNK2, the first bank pattern BNP1, the second bank pattern BNP2, the light emitting element LD, a second insulating layer INS2, the first contact electrode CNE1, the second contact electrode CNE2, the first reflective electrode REL1, the second reflective electrode REL2, and a third insulating layer INS3.

The first electrode ELT1 and the second electrode ELT2 may be located on the passivation layer PSV. According to an example, the first electrode ELT1 and the second electrode ELT2 may not overlap each other when viewed on a plane.

According to some embodiments, the first electrode ELT1 may be electrically connected to the bridge pattern BRP through the first contact portion CNT1. The second electrode ELT2 may be electrically connected to the power line PL through the second contact portion CNT2.

According to some embodiments, the first electrode ELT1 and the second electrode ELT2 may be formed in the same process. For example, the first electrode ELT1 and the second electrode ELT2 may include the same material.

According to some embodiments, the first electrode ELT1 and the second electrode ELT2 may include a conductive material. For example, the first electrode ELT1 and the second electrode ELT2 may include one of the known conductive materials. However, according to some embodiments, the first electrode ELT1 and the second electrode ELT2 may not include a reflective material. For example, the first electrode ELT1 and the second electrode ELT2 may not include Al or Ag. In this case, reliability of an electrical signal in the display device DD can be improved. This will be described below in more detail.

According to some embodiments, a first electrical signal may be provided through the first electrode ELT1, and a second electrical signal may be provided through the second electrode ELT2. In this case, the first electrical signal and the second electrical signal may form the electric field, and the light emitting element LD may be arranged based on the formed electric field.

The first insulating layer INS1 may be located on the passivation layer PSV. The first insulating layer INS1 may cover the first electrode ELT1 and the second electrode ELT2. According to an example, the first insulating layer INS1 may include any one of silicon oxide (SiOx), silicon nitride (SiNx), silicon oxynitride (SiOxNy), aluminum oxide (AlOx), and/or titanium oxide (TiOx). However, the present disclosure is not limited thereto.

The first bank BNK1 and the second bank BNK2 may be structures defining an emission area of the pixel PXL. According to an example, the emission area may be defined as an area surrounded by the first bank BNK1 and the second bank BNK2.

According to some embodiments, the first bank BNK1 and the second bank BNK2 may protrude in the display direction of the light emitting element LD (for example, the third direction DR3). According to an example, the first bank BNK1 and the second bank BNK2 may include an organic material and/or an inorganic material.

The first bank pattern BNP1 and the second bank pattern BNP2 may be located on the passivation layer PSV. According to an example, the first bank pattern BNP1 and the second bank pattern BNP2 may be located on the first insulating layer INS1.

According to some embodiments, the first bank pattern BNP1 and the second bank pattern BNP2 may protrude in the display direction of the light emitting element LD.

According to some embodiments, the first reflective electrode REL1 may be located on the first bank pattern BNP1, and the second reflective electrode REL2 may be located on the second bank pattern BNP2. Accordingly, the first reflective electrode REL1 and the second reflective electrode REL2 may reflect the light emitted from the light emitting element LD to improve luminous efficiency of the pixel PXL.

The light emitting element LD may be located on the first insulating layer INS1. The light emitting element LD may be located in the trench area defined by the first electrode ELT1 and the second electrode ELT2.

According to some embodiments, one end of the light emitting element LD may be located to face the first electrode ELT1, and the other end of the light emitting element LD may be located to face the second electrode ELT2.

According to some embodiments, one end of the light emitting element LD may be connected to the first contact electrode CNE1. The other end of the light emitting element LD may be connected to the second contact electrode CNE2.

At least a portion of the second insulating layer INS2 may be located on the light emitting element LD. At least a portion of the second insulating layer INS2 may overlap the active layer 12 of the light emitting element LD.

According to some embodiments, at least a portion of the second insulating layer INS2 may be provided on a rear surface of the light emitting element LD during a manufacturing process to fill a cavity (or groove) defined by a step of the first insulating layer INS1. According to an example, the second insulating layer INS2 may include an inorganic material.

The first contact electrode CNE1 may be located on the first insulating layer INS1. The first contact electrode CNE1 may be electrically connected to the light emitting element LD. According to an example, the first contact electrode CNE1 may be electrically connected to the first electrode ELT1 through a first contact hole CH1.

The second contact electrode CNE2 may be located on the first insulating layer INS1. The second contact electrode CNE2 may be electrically connected to the light emitting element LD. According to an example, the second contact electrode CNE2 may be electrically connected to the second electrode ELT2 through a second contact hole CH2.

According to some embodiments, the first contact electrode CNE1 and the second contact electrode CNE2 may include a transparent conductive material. According to an example, each of the first contact electrode CNE1 and the second contact electrode CNE2 may include any one of indium tin oxide (ITO), indium zinc oxide (IZO), zinc oxide (ZnO), and/or indium tin zinc oxide (ITZO). Detailed structures of the first contact electrode CNE1 and the second contact electrode CNE2 will be described later with reference to FIG. 6.

According to some embodiments, the first contact electrode CNE1 and the second contact electrode CNE2 may be formed in different processes. For example, after the first contact electrode CNE1 is patterned, the second contact electrode CNE2 may be patterned.

The first reflective electrode REL1 may be located on the first bank pattern BNP1. The second reflective electrode REL2 may be located on the second bank pattern BNP2.

According to some embodiments, the first reflective electrode REL1 and the second reflective electrode REL2 may include a reflective material. The first reflective electrode REL1 and the second reflective electrode REL2 may reflect the light emitted from the light emitting element LD.

According to some embodiments, the first reflective electrode REL1 might not be directly (or physically) connected to the first electrode ELT1. For example, the first reflective electrode REL1 and the first electrode ELT1 may be physically spaced apart from each other.

According to some embodiments, the second reflective electrode REL2 might not be directly (or physically) connected to the second electrode ELT2. For example, the second reflective electrode REL2 and the second electrode ELT2 may be physically spaced apart from each other.

According to some embodiments, the first reflective electrode REL1 and the second reflective electrode REL2 provided to function as a reflective barrier rib with respect to the light emitting element LD may be physically separated from the first electrode ELT1 and the second electrode ELT2. Accordingly, reliability of an electrical signal in the display device may be improved.

According to an example, experimentally, when the first electrode ELT1 is located on the first bank pattern BNP1 to function as the reflective barrier rib, it may be suitable to include a reflective material, for example, an Al-based material, to ensure reflectivity. However, the first electrode ELT1 may function as the reflective barrier rib, and at the same time, the first electrode ELT1 may function as a movement path of an electrical signal for light emitting of the light emitting element LD. In this case, the first contact electrode CNE1 for electrically connecting the first electrode ELT1 and the light emitting element LD should be connected to the first electrode ELT1. However, when the first electrode ELT1 includes the reflective material (for example, the Al-based material), at a point where the first electrode ELT1 and the first contact electrode CNE1 are physically connected (or contacted) with each other (for example, an area adjacent to a contact hole), a deviation or variation in resistance may occur, thereby reducing the reliability of the electrical signal.

However, according to some embodiments, a structure in which the first electrode ELT1 is not necessarily required to function as the reflective barrier rib can be provided. Accordingly, the deviation or variation in resistance due to the connection between electrode structures can be reduced or prevented, and the reliability of the electrical signal in the display device according to some embodiments can be increased.

Referring back to FIG. 5, the third insulating layer INS3 may be located on the first contact electrode CNE1, the first reflective electrode REL1, and/or the second insulating layer INS2. The third insulating layer INS3 might not be patterned in an area where the second contact electrode CNE2 is located. For example, the third insulating layer INS3 and the second contact electrode CNE2 might not overlap each other when viewed on a plane.

However, the structure of the pixel PXL is not limited to the above-described examples. According to some embodiments, the pixel PXL may further include an insulating layer additionally located on the second contact electrode CNE2 and the second reflective electrode REL2, and may further include a planarization layer for cancelling steps defined by each of the components of the display element unit DPL.

Hereinafter, structures of the reflective electrode REL and the first contact electrode CNE1 will be described with reference to FIGS. 5 and 6. FIG. 6 is a cross-sectional view illustrating a stacked structure of a reflective electrode and a first contact electrode. The reflective electrode REL shown in FIG. 6 may be the first reflective electrode REL1 and/or the second reflective electrode REL2.

The reflective electrode REL may include a light-transmitting layer 322 and a reflective layer 324. The reflective layer 324 may be located on the light-transmitting layer 322. Each of the first reflective electrode REL1 and the second reflective electrode REL2 may include the light-transmitting layer 322 and the reflective layer 324.

According to an example, the light-transmitting layer 322 of the first reflective electrode REL1 may be referred to as a first light-transmitting layer, and the light-transmitting layer 322 of the second reflective electrode REL2 may be referred to as a second light-transmitting layer. The reflective layer 324 of the first reflective electrode REL1 may be referred to as a first reflective layer, and the reflective layer 324 of the second reflective electrode REL2 may be referred to as a second reflective layer.

According to some embodiments, the light-transmitting layer 322 may have a transmissive property. The light-transmitting layer 322 may include at least one transmissive material layer. For example, the light-transmitting layer 322 may not include a reflective layer. Here, the transmissive property may mean a property of transmitting light in a predetermined value or more when light is provided. According to an example, the transmissive property may mean a transmittance of about 70% to about 80% or more, but the present disclosure is not limited thereto.

According to some embodiments, as described above, the light-transmitting layer 322 may include any one of indium tin oxide (ITO), indium zinc oxide (IZO), zinc oxide (ZnO), and/or indium tin zinc oxide (ITZO).

According to some embodiments, the reflective layer 324 may have a reflective property. The reflective layer 324 may include at least one reflective material layer. For example, the reflective layer 324 may include a single reflective layer or a plurality of reflective layers. Here, the reflective property may mean a property of reflecting at least a portion of light when light is provided.

According to some embodiments, the reflective layer 324 may include any one of Ag, Mg, Al, Pt, Pd, Au, Ni, Nd, Ir, Cr, Li, Ca, LiF/Ca, LiF/Al, Mo, Ti, and/or Cu. However, the material of the reflective layer 324 is not limited to the above-described examples, and the reflective layer 324 may include a known reflective material.

According to some embodiments, the light-transmitting layer 322 may be located closer to the first bank pattern BNP1 than the reflective layer 324 (refer to FIG. 5). The light-transmitting layer 322 may be located between the first bank pattern BNP1 and the reflective layer 324. The reflective layer 324 may be spaced apart from the substrate SUB further than the light-transmitting layer 322.

According to some embodiments, one surface of the reflective layer 324 may be in contact with the light-transmitting layer 322, and the other surface of the reflective layer 324 may be exposed. For example, the light-transmitting layer 322 might not be separately located on the other surface of the reflective layer 324.

However, according to some embodiments, a separate light-transmitting layer 322 may be additionally located on the other surface of the reflective layer 324. According to some embodiments, respective light-transmitting layers 322 may be located on both surfaces of the reflective layer 324.

As a result, according to some embodiments, the reflective electrode REL may have a structure including at least the reflective layer 324, and the light provided from the light emitting element LD may be reflected by the reflective layer 324.

According to some embodiments, the first contact electrode CNE1 may have a transmissive property. The first contact electrode CNE1 may include a contact light-transmitting layer 332 having the transmissive property. The first contact electrode CNE1 may not include a reflective material layer. According to an example, as described above, the contact light-transmitting layer 332 may include any one of indium tin oxide (ITO), indium zinc oxide (IZO), zinc oxide (ZnO), and/or indium tin zinc oxide (ITZO).

According to some embodiments, the first contact electrode CNE1, the first reflective electrode REL1, and the second reflective electrode REL2 may include layers formed in the same process. For example, the light-transmitting layer 322 and the contact light-transmitting layer 332 may be formed in the same process. The light-transmitting layer 322 and the contact light-transmitting layer 332 may be patterned at the same time. For example, the light-transmitting layer 322 may include the same material as the contact light-transmitting layer 332.

Figure 16:
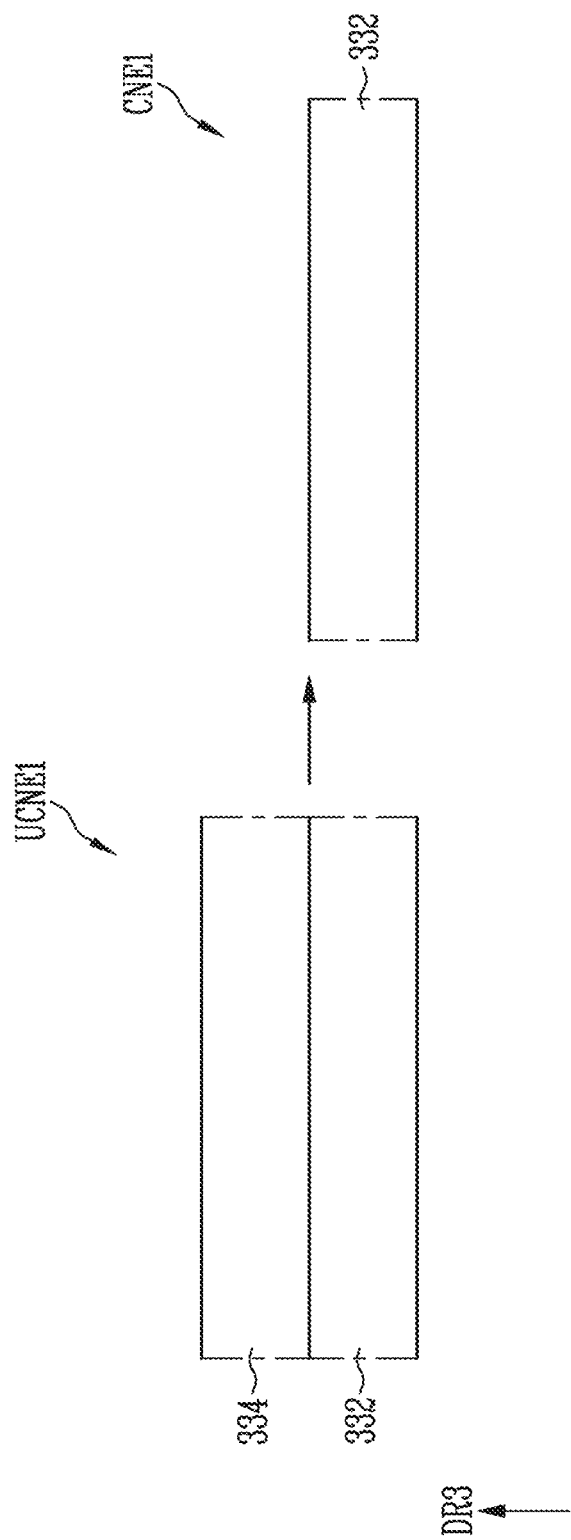
FIG. 16 is a cross-sectional view illustrating a process of removing a contact reflective layer in the method of manufacturing the display device.

According to some embodiments, an electrode pattern (for example, a contact reflective layer 334, as shown in FIG. 16) formed in the same process as the reflective layer 324 may be formed on the contact light-transmitting layer 332, and then removed through a separate process. According to an example, the thickness of the light-transmitting layer 322 may be greater than or equal to the thickness of the contact light-transmitting layer 332.

According to some embodiments, the light-transmitting layer 322 of the first reflective electrode REL1 and the light-transmitting layer 322 of the second reflective electrode REL2 may be formed in the same process, and may include the same material. The reflective layer 324 of the first reflective electrode REL1 and the reflective layer 324 of the second reflective electrode REL2 may be formed in the same process, and may include the same material.

Hereinafter, the pixel PXL according to other embodiments will be described. Descriptions that may overlap the above description will be omitted or simplified.

First, the pixel PXL according to the second embodiments will be described with reference to FIGS. 7 and 8. FIG. 7 is a plan view illustrating a pixel according to second embodiments. FIG. 8 is a cross-sectional view taken along the line II-II' of FIG. 7.

The pixel PXL according to the second embodiments may be different from the pixel PXL according to the first embodiments in that the first contact electrode CNE1 is integrated into the first reflective electrode REL1 described above with reference to FIG. 5 to provide a single configuration, and the second contact electrode CNE2 is integrated into the second reflective electrode REL2 described above with reference to FIG. 5 to provide a single configuration.

According to some embodiments, at least a portion of the first contact electrode CNE1 may be connected to the light emitting element LD, and at least another portion of the first contact electrode CNE1 may be located on the first bank pattern BNP1. At least a portion of the second contact electrode CNE2 may be connected to the light emitting element LD, and at least another portion of the second contact electrode CNE2 may be located on the second bank pattern BNP2.

According to some embodiments, the first contact electrode CNE1 may include a (1-1)th area 412 and a (2-1)th area 422. The first contact electrode CNE1 may include the contact light-transmitting layer 332 in the (1-1)th area 412. The first contact electrode CNE1 may include the light-transmitting layer 322 and the reflective layer 324 in the (2-1)th area 422.

According to some embodiments, the first contact hole CH1 may be located in the (1-1)th area 412. Accordingly, the first electrode ELT1 might not be directly (or physically) connected to the reflective layer 324, but may be electrically connected to the first contact electrode CNE1.

According to some embodiments, the second contact electrode CNE2 may include a (1-2)th area 414 and a (2-2)th area 424. The second contact electrode CNE2 may include the contact light-transmitting layer 332 in the (1-2)th area 414. The second contact electrode CNE2 may include the light-transmitting layer 322 and the reflective layer 324 in the (2-2)th area 424.

According to an example, the contact light-transmitting layer 332 of the first contact electrode CNE1 may be referred to as a first contact light-transmitting layer, and the contact light-transmitting layer 332 of the second contact electrode CNE2 may be referred to as a second contact light-transmitting layer.

According to some embodiments, the second contact hole CH2 may be located in the (1-2)th area 414. Accordingly, the second electrode ELT2 might not be directly (or physically) connected to the reflective layer 324, but may be electrically connected to the second contact electrode CNE2.

According to some embodiments, the first contact electrode CNE1 and the second contact electrode CNE2 may be configured to transmit light in the (1-1)th area 412 and the (1-2)th area 414, respectively, to transmit the light emitted from the light emitting element LD.

According to some embodiments, the first contact electrode CNE1 and the second contact electrode CNE2 may be located on the first bank pattern BNP1 and the second bank pattern BNP2 in the (2-1)th area 422 and the (2-2)th area 424, respectively, to reflect light. Accordingly, the light emitted from the light emitting element LD may be reflected in the display direction.

According to some embodiments, the first contact electrode CNE1 and the second contact electrode CNE2 may be formed in the same process. For example, the first contact electrode CNE1 and the second contact electrode CNE2 may include a layer including the same material. The contact light-transmitting layer 332 of the first contact electrode CNE1 and the contact light-transmitting layer 332 of the second contact electrode CNE2 may be patterned in the same process and may include the same material.

Next, the pixel PXL according to the third embodiments will be described with reference to FIGS. 9 and 10. FIG. 9 is a plan view illustrating a pixel according to third embodiments. FIG. 10 is a cross-sectional view taken along the line III-III' of FIG. 9.

Referring to FIGS. 9 and 10, the pixel PXL according to the third embodiments may be different from the pixel PXL according to the first embodiments in that each of the first contact electrode CNE1, the second contact electrode CNE2, the first reflective electrode REL1, and the second reflective electrode REL2 includes a layer formed in the same process.

According to some embodiments, the contact light-transmitting layer 332 of each of the first contact electrode CNE1 and the second contact electrode CNE2 may be formed in the same process as the light-transmitting layer 322 of the first reflective electrode REL1 and the second reflective electrode REL2.

Accordingly, the contact light-transmitting layer 332 of each of the first contact electrode CNE1 and the second contact electrode CNE2 and the light-transmitting layer 322 of the first reflective electrode REL1 and the second reflective electrode REL2 may be patterned in the same process and may include the same material.

According to some embodiments, the thickness of the contact light-transmitting layer 332 of the first contact electrode CNE1 may be less than or equal to the thickness of the light-transmitting layer 322 of the first reflective electrode REL1. The thickness of the contact light-transmitting layer 332 of the second contact electrode CNE2 may be less than or equal to the thickness of the light-transmitting layer 322 of the second reflective electrode REL2.

According to some embodiments, the second insulating layer INS2 may include an organic material. When the second insulating layer INS2 includes the organic material, the second insulating layer INS2 may be located to have a greater height on the light emitting element LD as compared to some embodiments including the inorganic material (refer to the first embodiments of FIG. 5).

Hereinafter, a method of manufacturing a display device according to some embodiments will be described with reference to FIGS. 11 to 21. For the convenience of description, descriptions that may overlap the above description will be simplified or omitted.

Figure 17:
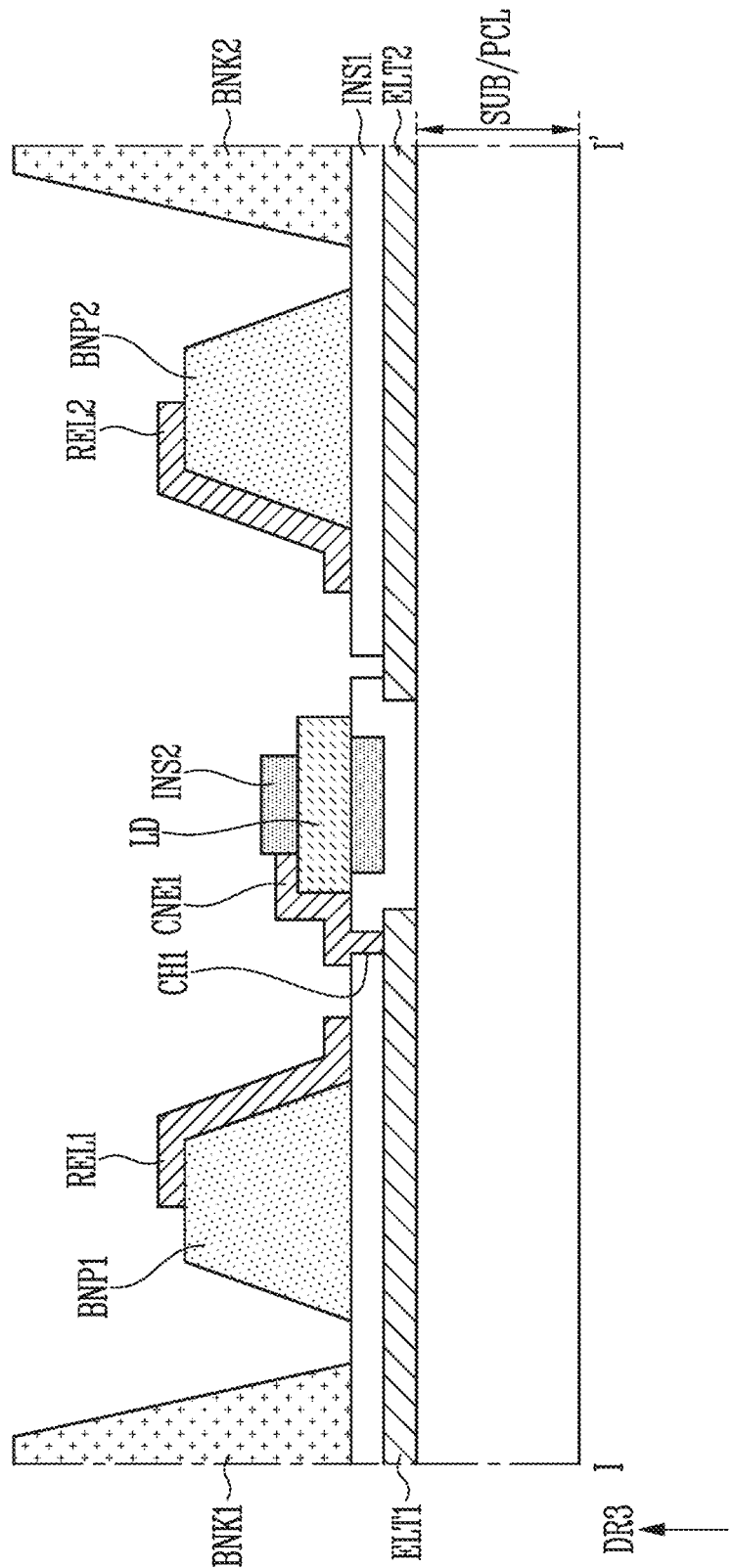
Figure 18:
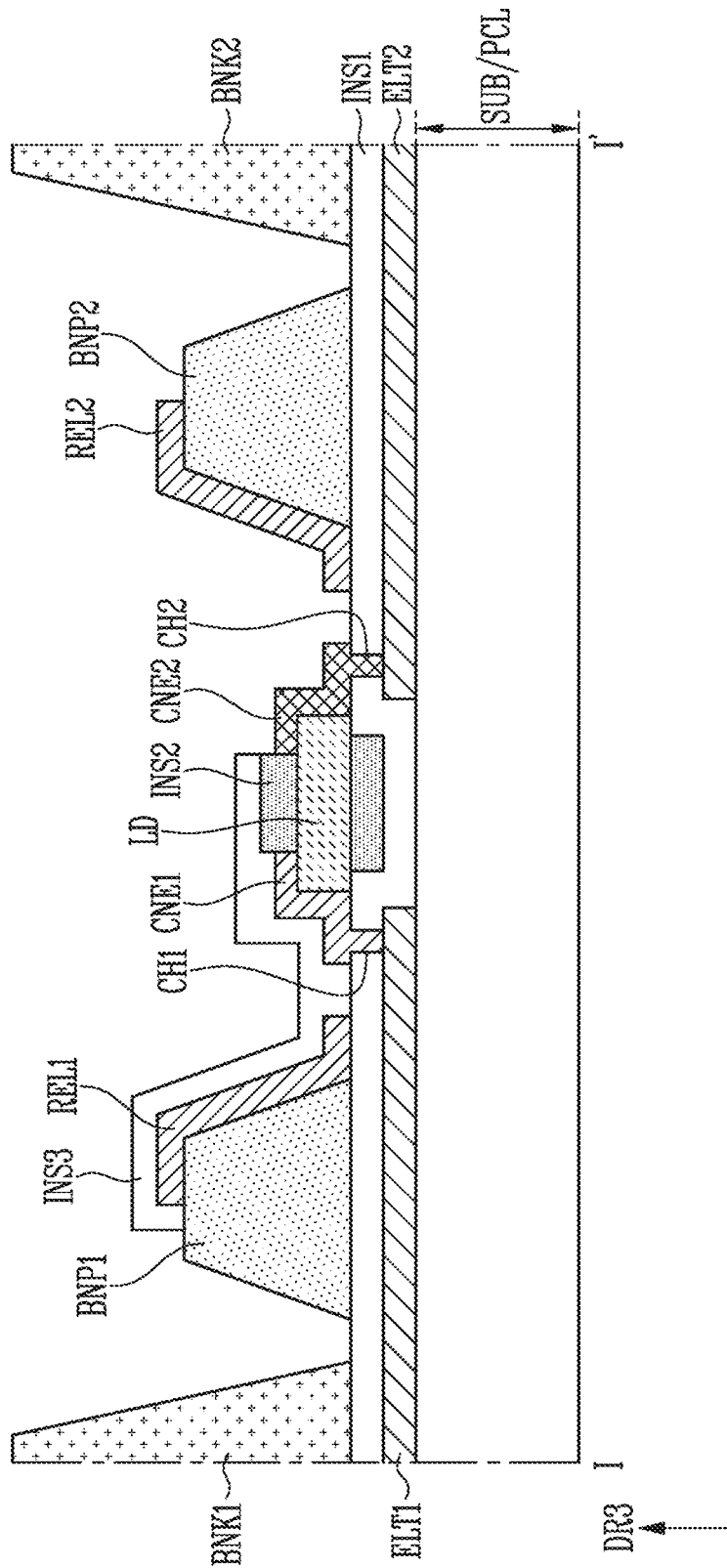
Figure 19:
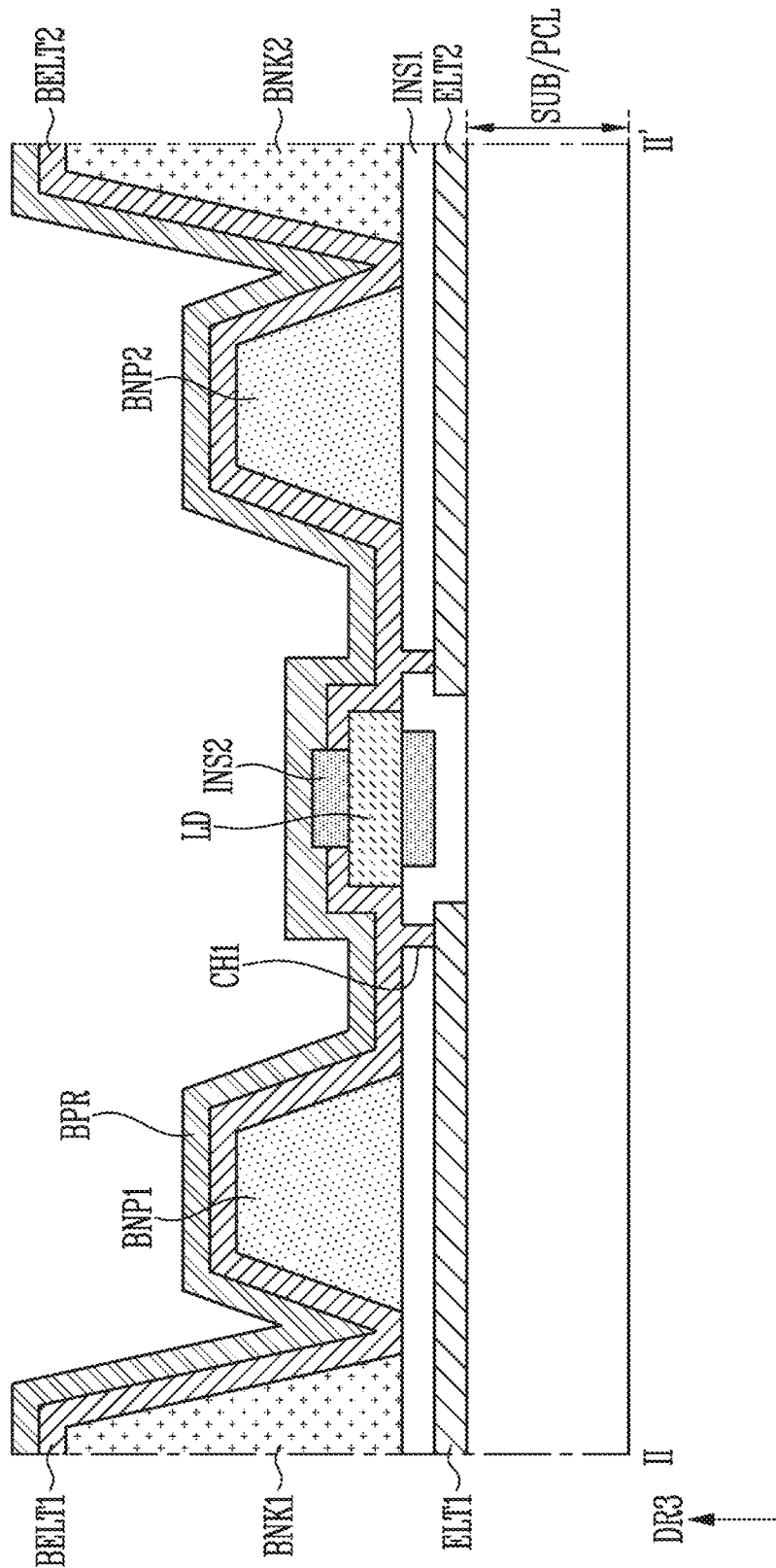
Figure 20:
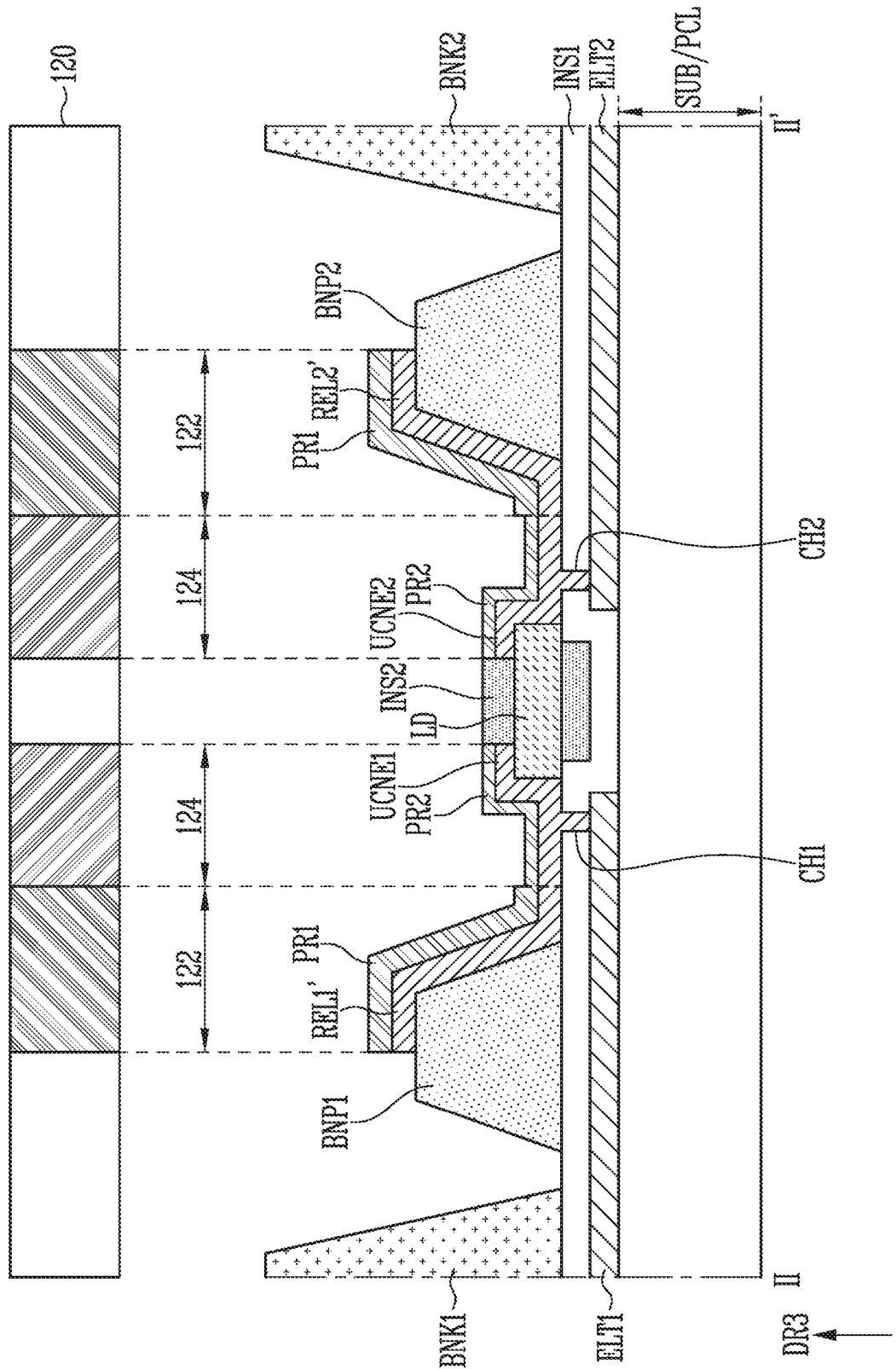
Figure 21:
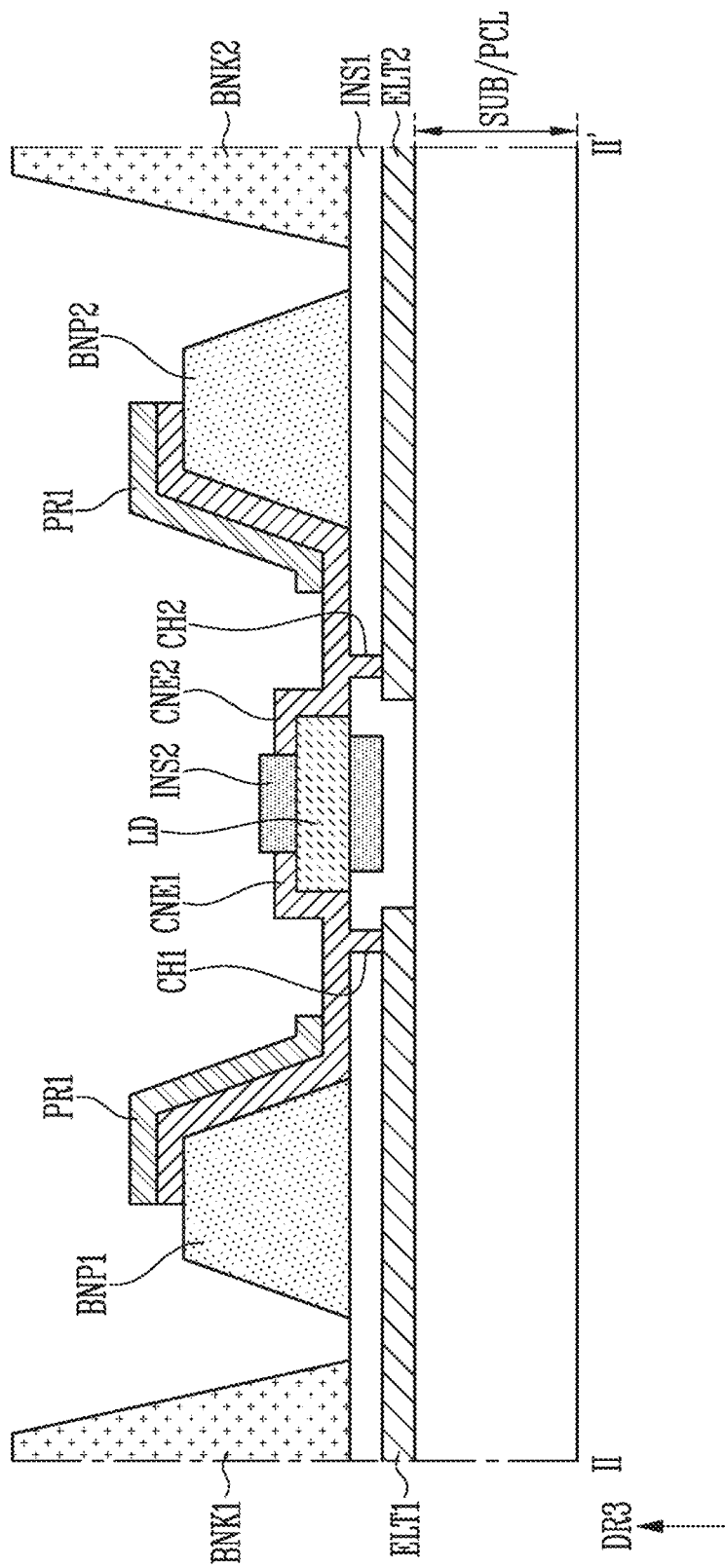

FIGS. 11 to 15 and 17 to 21 are cross-sectional views illustrating process operations for explaining a method of manufacturing a display device. FIGS. 11 to 15, 17, and 18 mainly show stacked structures corresponding to a cross-section taken along the line I-I' of FIG. 4. FIG. 16 is a cross-sectional view illustrating a process of removing a contact reflective layer in the method of manufacturing the display device. FIGS. 19 to 21 mainly show stacked structures corresponding to a cross-section taken along the line II-II' of FIG. 7.

FIGS. 11 to 18 may be diagrams illustrating a method of manufacturing a display device for providing the display device according to the first embodiments. FIGS. 19 to 21 may be diagrams illustrating a method of manufacturing a display device for providing the display device according to the second embodiments.

First, a method of manufacturing the display device according to the first embodiments will be described with reference to FIGS. 11 to 18.

Figure 11:
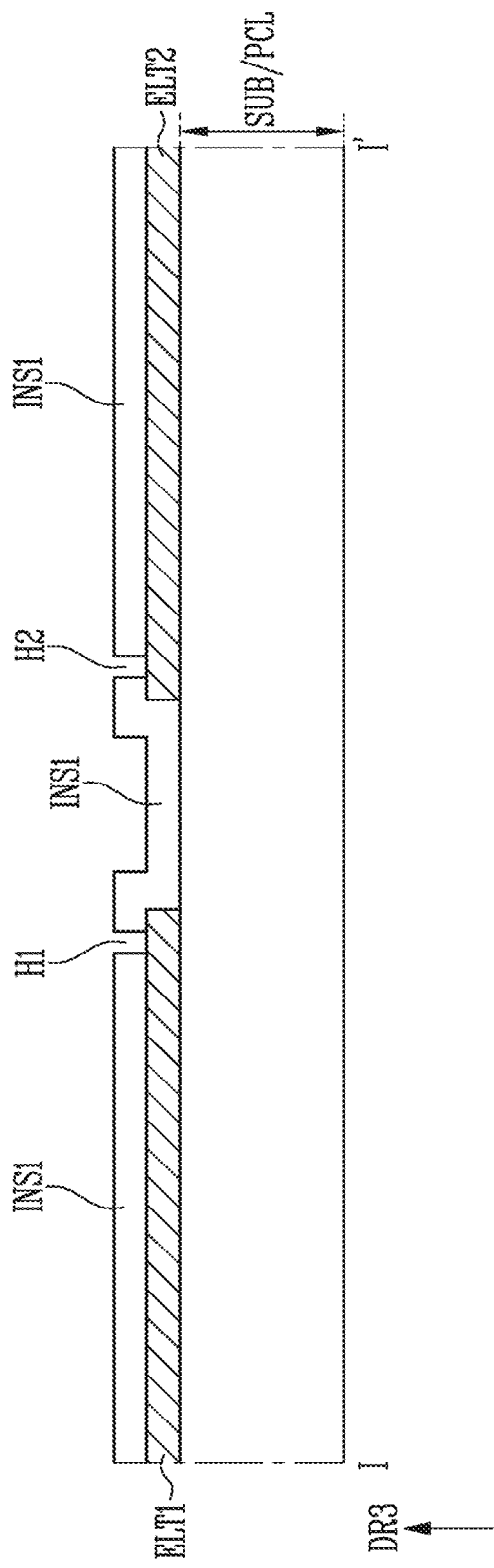
FIGS. 11 to 15 and 17 to 21 are cross-sectional views illustrating process operations for explaining a method of manufacturing a display device.

Referring to FIG. 11, a substrate SUB may be provided (or prepared), and a pixel circuit unit PCL may be located on the substrate SUB. Individual components (for example, a transistor Tr) of the pixel circuit unit PCL may be patterned by a conventional photolithography process using a mask. In addition, a first electrode ELT1 and a second electrode ELT2 may be located to be spaced apart from each other on the pixel circuit unit PCL. Thereafter, a first insulating layer INS1 may be located on the first electrode ELT1 and the second electrode ELT2, and a first hole H1 and a second hole H2 may be formed in the first insulating layer INS1.

Figure 12:
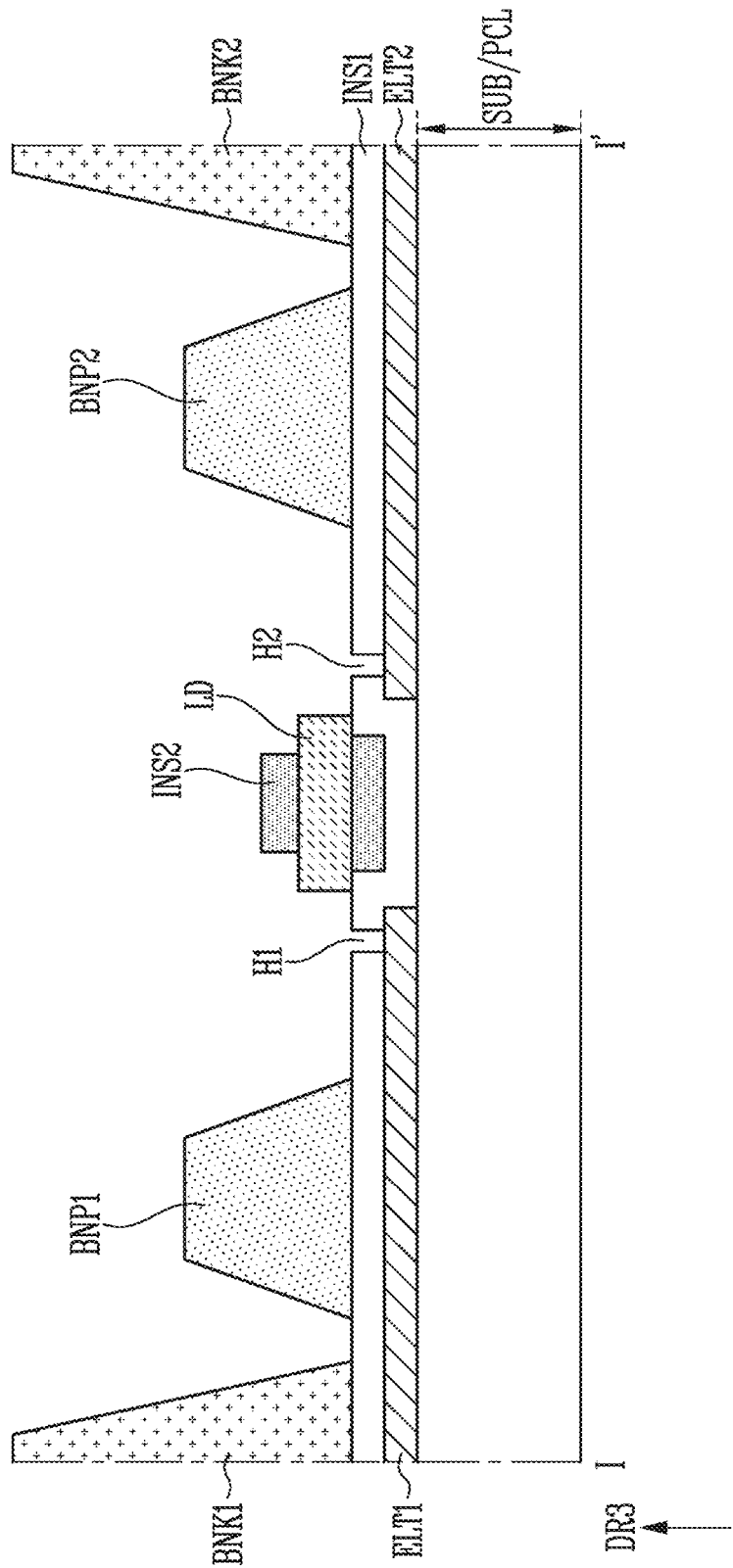

Referring to FIG. 12, a first bank pattern BNP1, a second bank pattern BNP2, a first bank BNK1, and a second bank BNK2 may be located on the first insulating layer INS1. The order in which the first bank pattern BNP1 and the second bank pattern BNP2, and the first bank BNK1 and the second bank BNK2 are formed may not be limited to specific embodiments. In addition, a light emitting element LD may be located adjacent to a cavity (or groove) defined by the first insulating layer INS1. In addition, a second insulating layer INS2 may be formed on the light emitting element LD. According to some embodiments, a portion of the second insulating layer INS2 may be located on a rear surface of the light emitting element LD.

Referring to FIGS. 11 and 12, the first bank pattern BNP1 and the second bank pattern BNP2 may be formed after the first electrode ELT1 and the second electrode ELT2 are located. According to some embodiments, the first electrode ELT1 might not be located on the first bank pattern BNP1, and the second electrode ELT2 might not be located on the second bank pattern BNP2.

Figure 13:
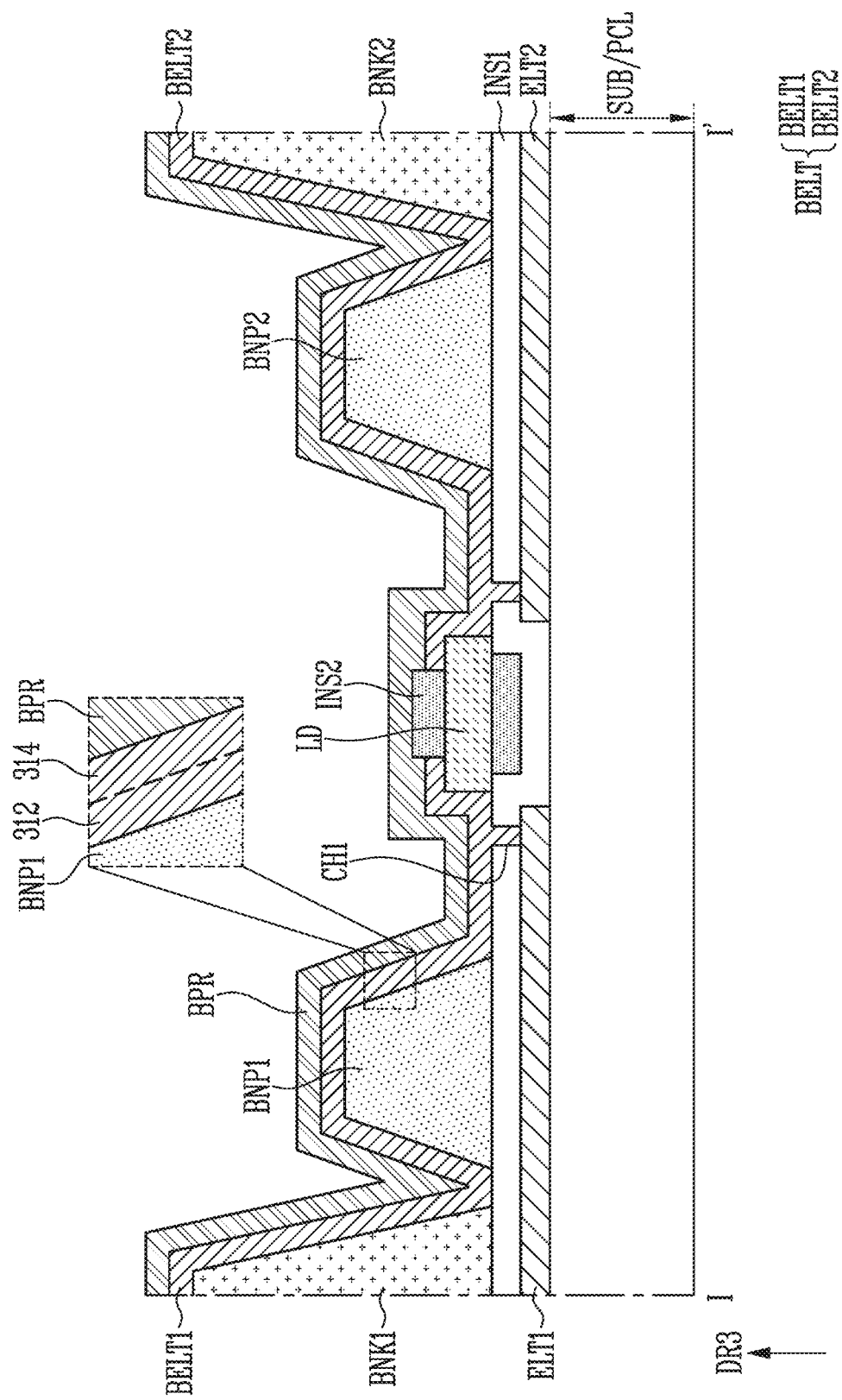

Referring to FIG. 13, a base electrode BELT may be formed, and a base photoresist layer BPR may be formed on the base electrode BELT. For example, a first base electrode BELT1 and a second base electrode BELT2 may be formed, and the base photoresist layer BPR may be formed to cover the first base electrode BELT1 and the second base electrode BELT2.

Here, the base photoresist layer BPR may include a photosensitive material. According to an example, the base photoresist layer BPR may include a positive photosensitive material or a negative photosensitive material. However, hereinafter, for convenience of description, some embodiments in which the base photoresist layer BPR includes the positive photosensitive material will be described.

According to some embodiments, the first base electrode BELT1 and the second base electrode BELT2 may include at least a base light-transmitting layer 312 and a base reflective layer 314. According to some embodiments, a separate light-transmitting layer may be additionally located on the base reflective layer 314. However, for convenience of description, some embodiments in which each of the first base electrode BELT1 and the second base electrode BELT2 includes the base light-transmitting layer 312 and the base reflective layer 314 will be described as an example.

According to some embodiments, the first base electrode BELT1 may be formed to cover the first bank pattern BNP1. Here, at least a portion of the first base electrode BELT1 located on the first bank pattern BNP1 may be provided as a first reflective electrode REL1 later. According to an example, the base light-transmitting layer 312 of the first base electrode BELT1 may be located adjacent to the first bank pattern BNP1. The base light-transmitting layer 312 may be located between the first bank pattern BNP1 and the base reflective layer 314.

According to some embodiments, the second base electrode BELT2 may be formed to cover the second bank pattern BNP2. Here, the second base electrode BELT2 located on the second bank pattern BNP2 may be provided as a second reflective electrode REL2 later. According to an example, the base light-transmitting layer 312 of the second base electrode BELT2 may be located adjacent to the second bank pattern BNP2. The base light-transmitting layer 312 may be located between the second bank pattern BNP2 and the base reflective layer 314.

In this operation, the first base electrode BELT1 and the second base electrode BELT2 may expose at least a portion of the second insulating layer INS2.

In this operation, at least a portion of the first base electrode BELT1 may be provided in the first hole H1 to provide a first contact hole CH1.

Figure 14:
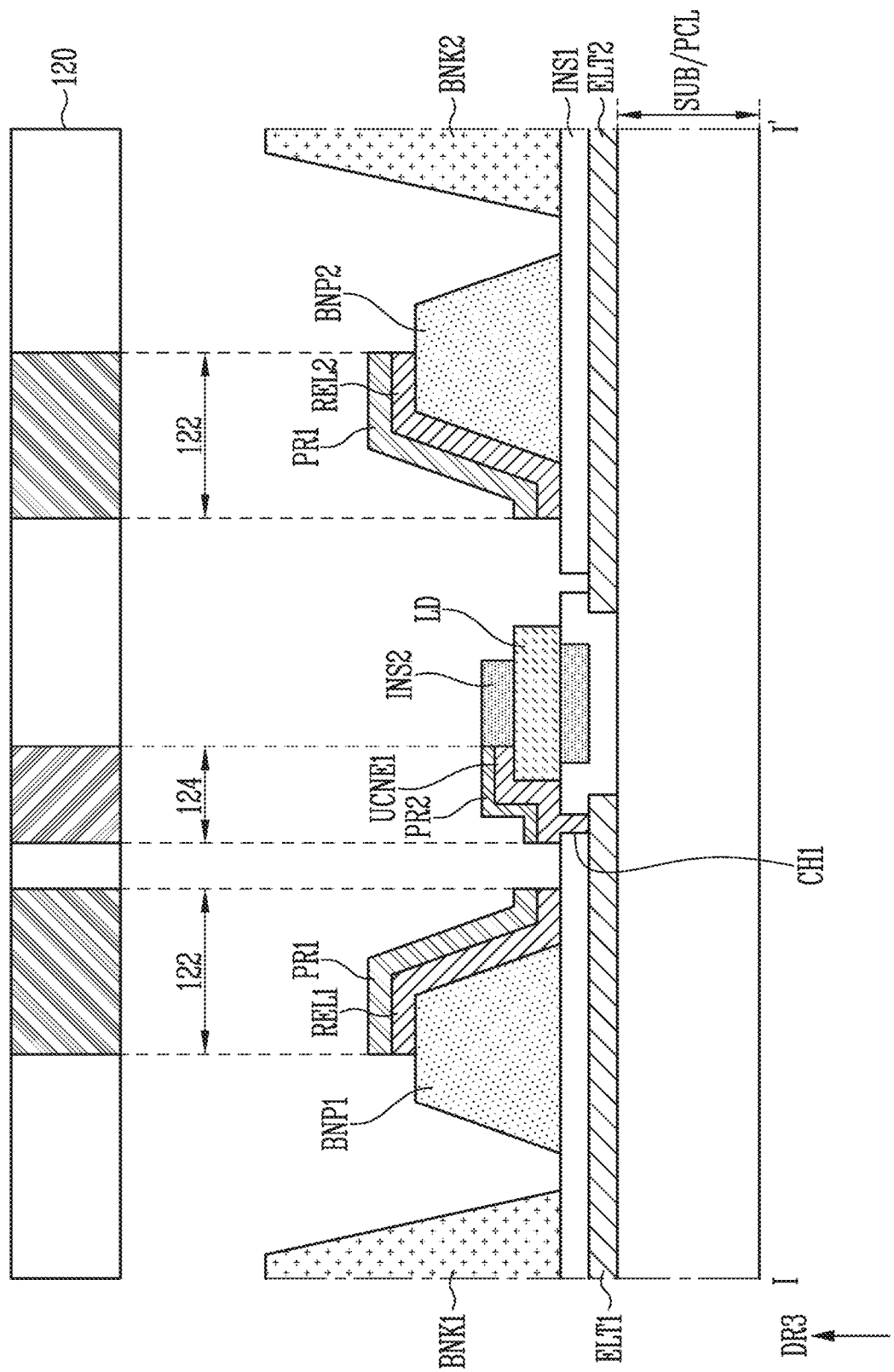

Referring to FIG. 14, a photolithography process using a mask 120 may be performed on the base photoresist layer BPR. The mask 120 may include a full-tone area 122 and a half-tone area 124. The light transmittance of the mask 120 in the full-tone area 122 may be less than the light transmittance of the mask 120 in the half-tone area 124. The light transmittance of the mask 120 in the full-tone area 122 and the half-tone area 124 may be less than the light transmittance of the mask 120 in other areas.

In this operation, a first photoresist layer PR1 may be provided (or formed) at a position corresponding to the full-tone area 122. According to an example, the first photoresist layer PR1 may be provided by the base photoresist layer BPR at the position corresponding to the full-tone area 122.

In this operation, a second photoresist layer PR2 may be provided (or formed) at a position corresponding to the half-tone area 124. According to an example, the second photoresist layer PR2 may be provided by removing at least a portion of the base photoresist layer BPR at the position corresponding to the half-tone area 124. Here, the thickness of the second photoresist layer PR2 may be less than the thickness of the first photoresist layer PR1.

In this operation, the base photoresist layer BPR may be removed at positions corresponding to areas other than the full-tone area 122 and the half-tone area 124.

In this operation, the first base electrode BELT1 and the second base electrode BELT2 may be etched using the first photoresist layer PR1 and the second photoresist layer PR2 as an etching mask. At this time, although the first base electrode BELT1 and the second base electrode BELT2 may be etched, the first base electrode BELT1 and the second base electrode BELT2 may still be located in areas where the first photoresist layer PR1 and the second photoresist layer PR2 are located.

In this operation, at least a portion of the first base electrode BELT1 may be provided as the first reflective electrode REL1, and at least a portion of the second base electrode BELT2 may be provided as the second reflective electrode REL2. In this case, the first reflective electrode REL1 and the second reflective electrode REL2 may be provided to include a light-transmitting layer 322 and a reflective layer 324. In this case, the reflective layer 324 may be located on the light-transmitting layer 322.

According to some embodiments, the light-transmitting layer 322 of the first reflective electrode REL1 and the second reflective electrode REL2 may be substantially the same as the base light-transmitting layer 312 of the first base electrode BELT1 and the second base electrode BELT2. The reflective layer 324 of the first reflective electrode REL1 and the second reflective electrode REL2 may be substantially the same as the base reflective layer 314 of the first base electrode BELT1 and the second base electrode BELT2.

According to some embodiments, positions where the first reflective electrode REL1 and the second reflective electrode REL2 are provided may correspond to positions of the full-tone area 122 of the mask 120. A position where a first unetched contact electrode UCNE1 is provided may correspond to a position of the half-tone area 124 of the mask 120.

However, in this operation, the first base electrode BELT1 located adjacent to the light emitting element LD (that is, corresponding to the position of the second photoresist layer PR2) may be provided as the first unetched contact electrode UCNE1. In this case, the first unetched contact electrode UCNE1 may be provided to include a contact light-transmitting layer 332, and a contact reflective layer 334 located on the contact light-transmitting layer 332. In this case, the contact light-transmitting layer 332 may be patterned in the same process as the base light-transmitting layer 312, and may include the same material.

Figure 15:
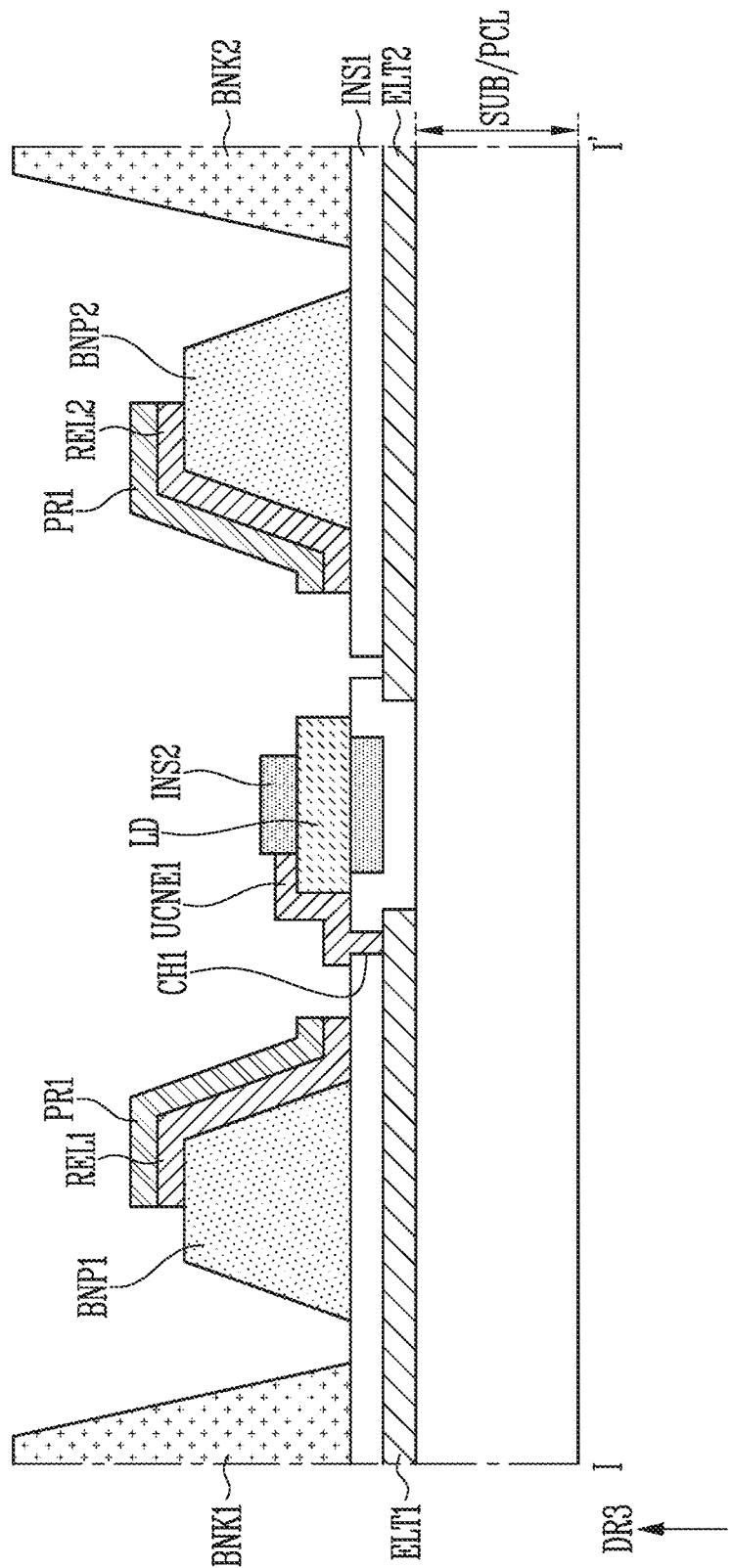

Referring to FIG. 15, the second photoresist layer PR2 may be removed. According to an example, the second photoresist layer PR2 may be removed by an etch-back process, but the present disclosure is not limited thereto. Accordingly, in this operation, at least a portion of the first unetched contact electrode UCNE1 may be exposed.

Referring to FIG. 16, the first unetched contact electrode UCNE1 may be etched to provide the first contact electrode CNE1. Here, by removing the contact reflective layer 334 included in the first unetched contact electrode UCNE1, the first contact electrode CNE1 including the contact light-transmitting layer 332, while not including the contact reflective layer 334, may be provided. Accordingly, at least a portion of the contact light-transmitting layer 332 that was covered by the contact reflection layer 334 may be exposed.

In some embodiments, when an additional light-transmitting layer is located on the contact reflective layer 334, the additional light-transmitting layer may also be removed in this operation. For example, after the contact light-transmitting layer 332 is located on one surface of the contact reflective layer 334, and the additional light-transmitting layer is located on the other surface of the contact reflective layer 334, the additional light-transmitting layer may be removed in this operation.

As the contact reflective layer 334 of the first unetched contact electrode UCNE1 is removed, the first contact electrode CNE1 may be provided, and the first contact electrode CNE1 located adjacent to the light emitting element LD may be provided to transmit light.

In this operation, an etching process for the first reflective electrode REL1 and the second reflective electrode REL2 may not be performed. That is, the reflective layer 324 configured to reflect light may still be located on the first reflective electrode REL1 and the second reflective electrode REL2, and then the light provided from the light emitting element LD may be reflected by the reflective layer 324.

As described above, the contact light-transmitting layer 332 of the first contact electrode CNE1 may be formed in the same process as the light-transmitting layer 322 of the first reflective electrode REL1 and the second reflective electrode REL2. Accordingly, the contact light-transmitting layer 332 of the first contact electrode CNE1 may include the same material as the light-transmitting layer 322 of the first reflective electrode REL1 and the second reflective electrode REL2. That is, the contact light-transmitting layer 332 may be formed in the same process as the base light-transmitting layer 312 of the base electrode BELT, and may include the same material.

Meanwhile, because the first contact electrode CNE1 is provided by removing the contact reflective layer 334 of the first unetched contact electrode UCNE1, the thickness of the light-transmitting layer 322 of the first contact electrode CNE1 may be less than or equal to the thickness of the light-transmitting layer 322 of the first reflective electrode REL1 and the second reflective electrode REL2.

Referring to FIG. 17, the first photoresist layer PR1 may be removed. According to an example, the first photoresist layer PR1 may be removed by an etch-back process, but the present disclosure is not limited thereto. In this operation, the first reflective electrode REL1 and the second reflective electrode REL2 may be exposed.

Referring to FIG. 18, a third insulating layer INS3 may be formed, and a second contact electrode CNE2 may be formed. As described above, the second contact electrode CNE2 may include a transparent conductive material to transmit the light provided from the light emitting element LD.

In this operation, the third insulating layer INS3 may be patterned to cover the first reflective electrode REL1 and the first contact electrode CNE1, but might not be patterned in an area where the second contact electrode CNE2 is to be formed.

In this operation, the second contact electrode CNE2 may be patterned after the third insulating layer INS3 is formed.

In this operation, at least a portion of the second contact electrode CNE2 may be provided in the second hole H2 to provide a second contact hole CH2.

According to some embodiments, the second contact electrode CNE2 may be formed in a process different from that of the first contact electrode CNE1, the first reflective electrode REL1, and the second reflective electrode REL2. Accordingly, unlike the process for forming the first contact electrode CNE1, there is no need to additionally perform a separate process for removing the reflective layer with respect to the second contact electrode CNE2 (e.g., there is no need for patterning a layer containing the transparent conductive material)

Next, a method of manufacturing the display device according to the second embodiments will be described with reference to FIGS. 19 to 21. For convenience of description, descriptions that may overlap the above description will be omitted or simplified.

Referring to FIG. 19, a first base electrode BELT1 and a second base electrode BELT2 may be formed, and a base photoresist layer BPR may be formed on the first base electrode BELT1 and the second base electrode BELT2. Here, the first base electrode BELT1 and the second base electrode BELT2 may include at least a base light-transmitting layer 312 and a base reflective layer 314.

Referring to FIG. 20, a photolithography process using a mask 120 may be performed on the base photoresist layer BPR. The mask 120 may include a full-tone area 122 and a half-tone area 124.

In this operation, at least a portion of each of the first base electrode BELT1 and the second base electrode BELT2 may be removed.

In this operation, a first reflective electrode REL1' and a second reflective electrode REL2' may be provided at positions corresponding to the full-tone area 122 of the mask 120. In this case, the positions where the first reflective electrode REL1' and the second reflective electrode REL2' are provided may correspond respectively to the (2-1)th area 422 and the (2-2)th area 424 described above with reference to FIG. 8. That is, the first reflective electrode REL1' and the second reflective electrode REL2' may include a light-transmitting layer 322 and a reflective layer 324. The first reflective electrode REL1' and the second reflective electrode REL2' may be located under a first photoresist layer PR1.

In this operation, a first unetched contact electrode UCNE1 and a second unetched contact electrode UCNE2 may be provided at positions corresponding to the half-tone area 124 of the mask 120. In this case, the positions where the first unetched contact electrode UCNE1 and the second unetched contact electrode UCNE2 are provided may correspond to the (1-1)th area 412 and the (1-2)th area 414 described above with reference to FIG. 8. The first unetched contact electrode UCNE1 and the second unetched contact electrode UCNE2 may be located under a second photoresist layer PR2.

Here, the second unetched contact electrode UCNE2 may have substantially the same structure as the first unetched contact electrode UCNE1 described above with reference to FIG. 16. For example, the second unetched contact electrode UCNE2 may include a contact light-transmitting layer 332 and a contact reflective layer 334.

In this operation, the first photoresist layer PR1 may be provided at a position corresponding to the full-tone area 122. In this operation, the second photoresist layer PR2 may be provided at a position corresponding to the half-tone area 124. According to some embodiments, because the full-tone area 122 and the half-tone area 124 are adjacent to each other, the first photoresist layer PR1 and the second photoresist layer PR2 may be adjacent to each other.

In this operation, the first reflective electrode REL1' and the first unetched contact electrode UCNE1 may be adjacent to each other and connected to each other. The second reflective electrode REL2' and the second unetched contact electrode UCNE2 may be adjacent to each other and connected to each other.

However, according to some embodiments, the full-tone area 122 and the half-tone area 124 may be spaced apart from each other to perform the photolithography process. In this case, the first unetched contact electrode UCNE1 and the first reflective electrode REL1' may be spaced apart from each other, and the second unetched contact electrode UCNE2 and the second reflective electrode REL2' may be spaced apart from each other. In some embodiments, a subsequent process may be performed to provide the first unetched contact electrode UCNE1 as a first contact electrode CNE1, and the second unetched contact electrode UCNE2 as a second contact electrode CNE2. Accordingly, the pixel PXL according to the third embodiments described above with reference to FIGS. 9 and 10 may be provided.

Referring to FIG. 21, the second photoresist layer PR2 may be removed to expose the first unetched contact electrode UCNE1 and the second unetched contact electrode UCNE2. Thereafter, the contact reflective layer 334 included in the first unetched contact electrode UCNE1 and the second unetched contact electrode UCNE2 may be etched. Accordingly, in areas where the first unetched contact electrode UCNE1 and the second unetched contact electrode UCNE2 are located, the contact reflective layer 334 may not be separately included, and the contact light-transmitting layer 332 may be arranged.

As described above, the first unetched contact electrode UCNE1 and the first reflective electrode REL1' may be connected to each other, and the second unetched contact electrode UCNE2 and the second reflective electrode REL2' may be connected to each other. Accordingly, by removing the contact reflective layer 334 for the first unetched contact electrode UCNE1 and the second unetched contact electrode UCNE2, the first contact electrodes CNE1 and the second contact electrode CNE2 described above with reference to FIG. 8 may be provided.

Thereafter, in some embodiments, the first photoresist layer PR1 may be removed to provide the pixel PXL according to the second embodiments. According to some embodiments, a planarization layer and/or an insulating layer may be further located.

According to embodiments of the present disclosure, a reflective electrode structure in which the deviation in resistance does not occur may be implemented. Accordingly, the reliability of the electrical signal in the display device can be improved, and the display device with improved luminous efficiency can be provided.

The present disclosure are not limited to the above, and aspects that are not mentioned may be clearly understood by those skilled in the art from the present specification and the accompanying drawings.

The above-described descriptions are merely illustrative of the technical spirit of the present disclosure. Those skilled in the art will appreciate that various modifications and changes can be made to the present disclosure without departing from the spirit and scope of the present disclosure. Accordingly, the embodiments of the present disclosure described above may be implemented separately or in combination with each other.

Accordingly, the embodiments disclosed in the present specification are not intended to limit the technical spirit of the present disclosure, but to explain the technical spirit. The scope of the technical spirit of the present disclosure is not limited by these embodiments. The scope of protection of the present disclosure should be interpreted by the appended claims, with functional equivalents thereof to be include therein, and all technical spirits within the scope equivalent thereto should be construed as being included in the scope of the present disclosure.

What is claimed is:

1. A display device, comprising:
a substrate;
a first electrode and a second electrode on the substrate, and spaced apart from each other;
a light emitting element between the first electrode and the second electrode;
a first bank pattern and a second bank pattern protruding in a display direction of the display device;
a first contact electrode and a second contact electrode electrically connecting the light emitting element to the first electrode and the second electrode, respectively, the first contact electrode comprising a first contact light-transmitting layer; and
a first reflective electrode comprising a first reflective layer, and a first light-transmitting layer comprising a same material as the first contact light-transmitting layer, at least a portion of the first reflective electrode being on the first bank pattern.

2. The display device of claim 1, wherein the first reflective electrode is spaced apart from the first contact electrode.

3. The display device of claim 1, further comprising a second reflective electrode, at least a portion of which being on the second bank pattern, and comprising a second light-transmitting layer and a second reflective layer.

4. The display device of claim 3, wherein the first light-transmitting layer comprises a same material as the second light-transmitting layer, and
wherein the first reflective layer comprises a same material as the second reflective layer.

5. The display device of claim 1, wherein the first light-transmitting layer comprises any one of indium tin oxide (ITO), indium zinc oxide (IZO), zinc oxide (ZnO), or indium tin zinc oxide (ITZO).

6. The display device of claim 1, wherein the first reflective layer comprises any one of Ag, Mg, Al, Pt, Pd, Au, Ni, Nd, Ir, Cr, Li, Ca, LiF/Ca, LiF/Al, Mo, Ti or Cu.

7. The display device of claim 1, wherein the first light-transmitting layer is between the first reflective layer and the first bank pattern.

8. The display device of claim 1, wherein a thickness of the first contact light-transmitting layer is less than or equal to a thickness of the first light-transmitting layer.

9. The display device of claim 1, further comprising:
a first insulating layer on the first electrode and the second electrode; and
a second insulating layer, at least a portion of which being on the light emitting element, and comprising an inorganic material.

10. The display device of claim 1, further comprising:
a first insulating layer on the first electrode and the second electrode; and
a second insulating layer, at least a portion of which being on the light emitting element, and comprising an organic material,
wherein the second contact electrode comprises a second contact light-transmitting layer, and wherein the first contact light-transmitting layer and the second contact light-transmitting layer comprise a same material.

* * * * *